United States Patent
Yamanaka et al.

(10) Patent No.: US 8,724,377 B2
(45) Date of Patent: May 13, 2014

(54) MEMORY DEVICE AND METHOD FOR MANUFACTURING THE SAME

(75) Inventors: Takaya Yamanaka, Mie-ken (JP); Susumu Shuto, Kanagawa-ken (JP); Yoshiaki Asao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 13/423,700

(22) Filed: Mar. 19, 2012

(65) Prior Publication Data
US 2013/0058161 A1 Mar. 7, 2013

(30) Foreign Application Priority Data

Sep. 7, 2011 (JP) ................................. 2011-194634

(51) Int. Cl.
*G11C 11/00* (2006.01)
(52) U.S. Cl.
USPC ........ 365/158; 365/130; 365/171; 365/225.5; 365/232
(58) Field of Classification Search
USPC ........................ 365/158, 130, 171, 225.5, 232
See application file for complete search history.

(56) References Cited

U.S. PATENT DOCUMENTS

| | | | |
|---|---|---|---|
| 7,209,380 B2 * | 4/2007 | Ezaki et al. ................. | 365/158 |
| 2013/0044537 A1 | 2/2013 | Ishigaki et al. | |

FOREIGN PATENT DOCUMENTS

| | | |
|---|---|---|
| JP | 2009-094226 | 4/2009 |
| JP | 2009-151885 A | 7/2009 |
| WO | WO 2011/087038 A | 7/2011 |

OTHER PUBLICATIONS

T. Ishigaki et al. A Multi-Level-Cell Spin-Transfer Torque Memory with Series-Stacked Magnetotunnel Junctions, VLSI Tech. Dig., 2010, pp. 47-48.
Background Art Information Sheet in one page dated Dec. 9, 2011.
Japanese Office Action in corresponding Japanese Application No. 2001-194634 dated Jan. 20, 2014, 7 pages.

* cited by examiner

*Primary Examiner* — Jason Lappas
(74) *Attorney, Agent, or Firm* — Knobbe, Martens Olson & Bear, LLP

(57) ABSTRACT

According to one embodiment, a memory device includes: a first signal line; a second signal line; a transistor; a first memory region; and a second memory region. The transistor controls a conduction of each of a current flowing between the first and the second signal lines and an opposite current. The first memory region has a first magnetic tunnel junction element. A magnetization direction thereof becomes parallel when a current flows in one direction, and the magnetization direction becomes antiparallel when a current in another direction. The second memory region has a second magnetic tunnel junction element. A magnetization direction thereof becomes parallel when a current flows in one direction, and becomes antiparallel when a current flows in another first direction.

13 Claims, 18 Drawing Sheets

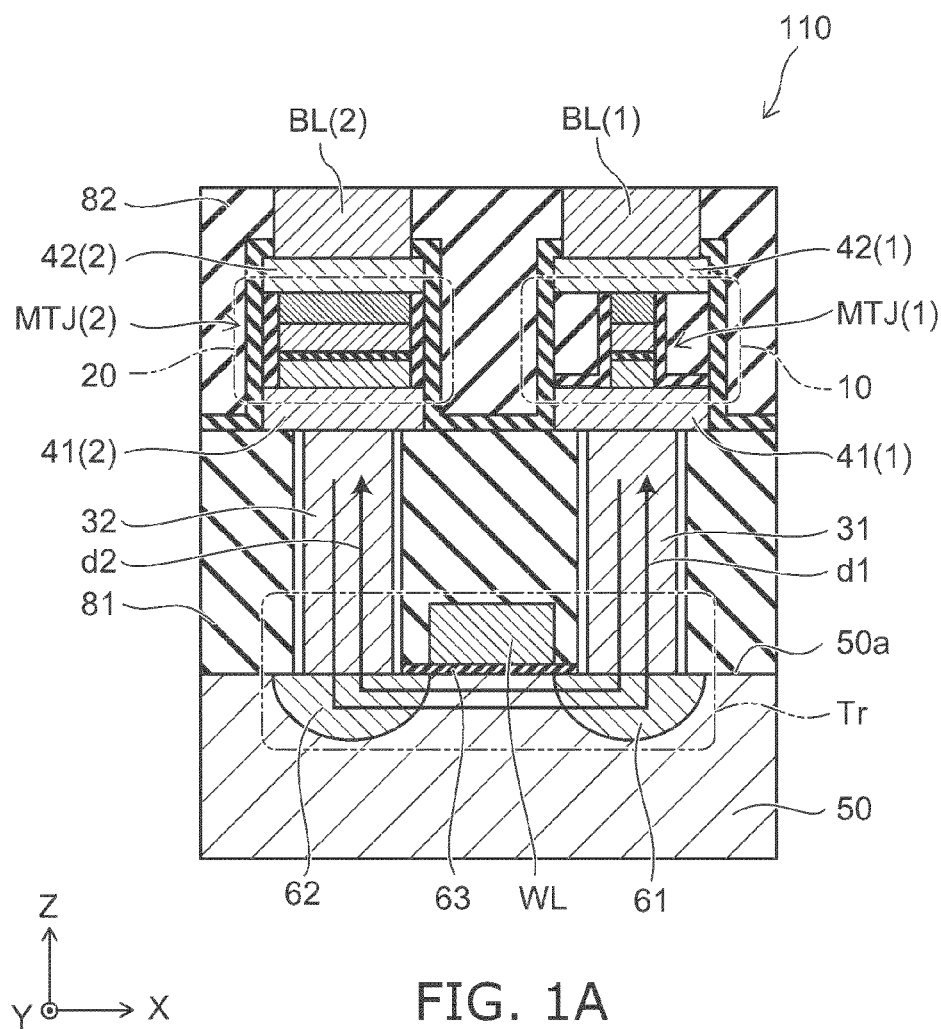
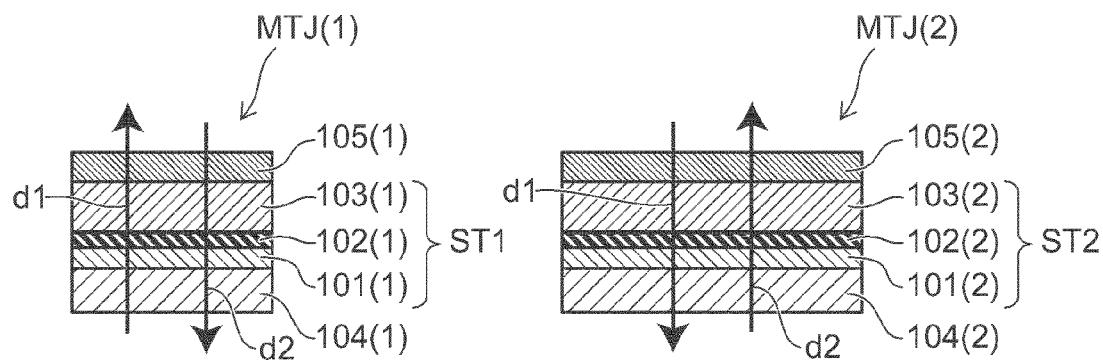
FIG. 1A
FIG. 1B
FIG. 1C

MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-194634, filed on Sep. 7, 2011; the entire contents of which are incorporated herein by reference.

FIELD

Embodiments described herein relate generally to a memory device and a method for manufacturing the same.

BACKGROUND

A magnetoresistive random access memory (MRAM) is one of nonvolatile memories which stores information utilizing a change in the resistance of a magnetic tunnel junction (MTJ) element. The MTJ element includes a pair of ferromagnetic layers and a tunnel barrier layer provided between the pair of ferromagnetic layers. The MTJ element is an element which, according to a parallel or antiparallel state in a magnetization direction of the ferromagnetic layer, changes the resistance value with respect to a tunnel current flowing through the tunnel barrier layer. In a memory device employing such an MRAM, in order to realize a multi-valued (not less than ternary) memory, it should be desirable to simplify the element structure and the manufacturing process.

BRIEF DESCRIPTION OF THE DRAWINGS

FIGS. 1A to 1C are schematic cross sectional views illustrating the configuration of a memory device according to a first embodiment;

DETAILED DESCRIPTION

Figure 2:
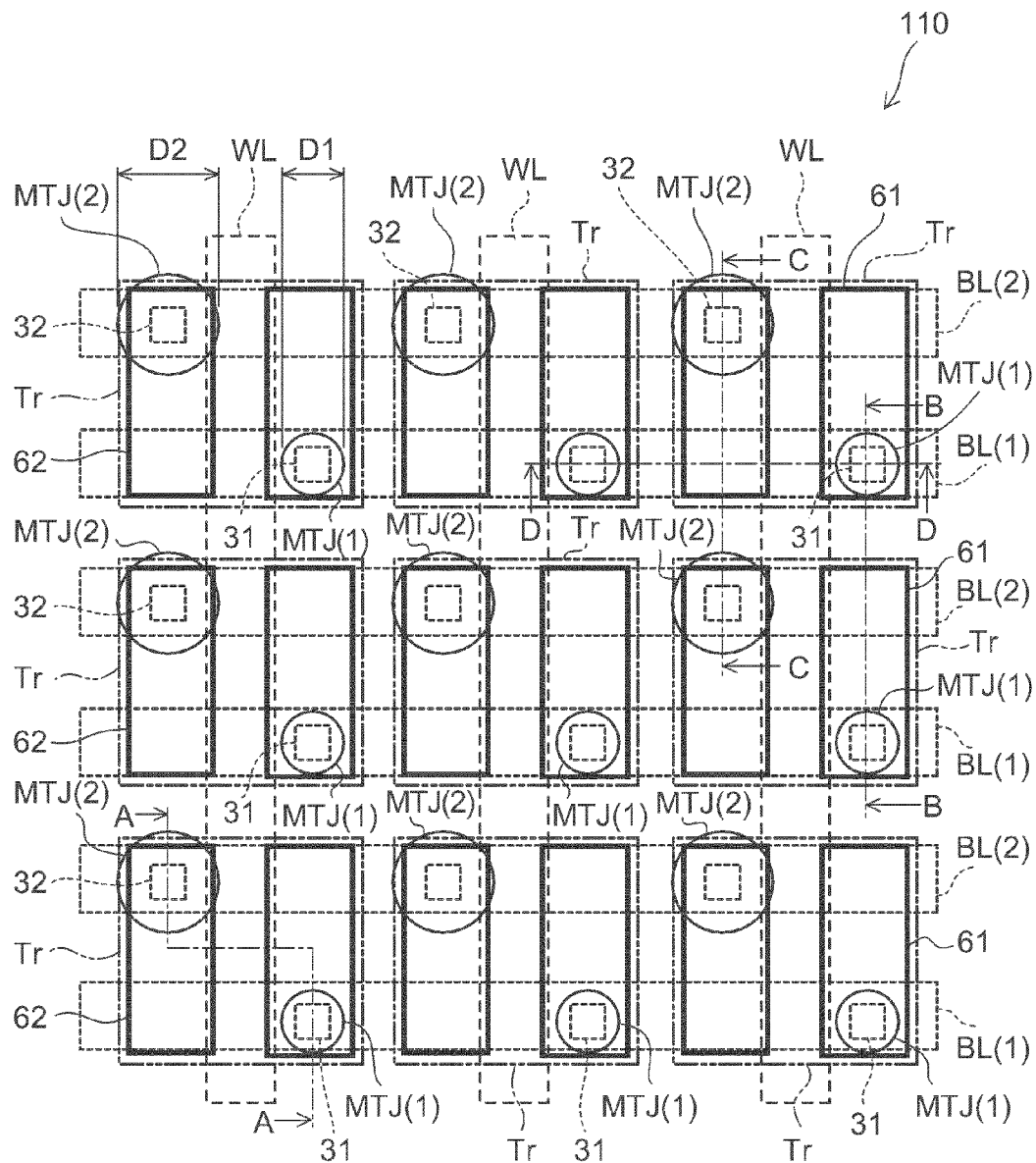
FIG. 2 is a schematic plan view illustrating the memory device according to the first embodiment.

In general, according to one embodiment, a memory device includes: a first signal line; a second signal line; a transistor configured to control a conduction of each of a current in a first direction flowing between the first signal line and the second signal line and a current in a second direction opposite to the first direction; a first memory region having a first magnetic tunnel junction element which is connected between the first signal line and one end of the transistor, a magnetization direction of which becomes parallel when a current not less than a first parallel threshold value flows in the first direction, and the magnetization direction of which becomes antiparallel when a current not less than a first antiparallel threshold value flows in the second direction; and a second memory region having a second magnetic tunnel junction element which is connected between the second signal line and other end of the transistor, a magnetization direction of which becomes parallel when a current not less than a second parallel threshold value larger than the first parallel threshold value flows in the second direction, and the magnetization direction of which becomes antiparallel when a current not less than a second antiparallel threshold value larger than the first antiparallel threshold value flows in the first direction.

In general, according to another embodiment, a method for manufacturing a memory device, includes: forming a transistor in a semiconductor substrate and covering the transistor with an insulating film; forming a first via which penetrates through the insulating film and is conductive with a source region or a drain region of the transistor, and a second via which penetrates through the insulating film and is conductive with the drain region or the source region of the transistor; forming a stacked film, wherein a magnetization free layer, a tunnel barrier layer, and a magnetization fixed layer are sequentially stacked on the first via and the second via; and etching the stacked film to form a first magnetic tunnel junction element on the first via while leaving a first stacked body which is one part of the stacked film, and to form a second magnetic tunnel junction element on the second via while leaving a second stacked body which is other part of the stacked film.

In general, according to another embodiment, a method for manufacturing a memory device, includes: forming a transistor in a semiconductor substrate and covering the transistor with an insulating film; forming a first via which penetrates through the insulating film and is conductive with a source region or a drain region of the transistor, and a second via which penetrates through the insulating film and is conductive with the drain region or the source region of the transistor; forming a first stacked film, wherein a first magnetization free layer, a first tunnel barrier layer, and a first magnetization fixed layer are sequentially stacked on the first via and the second via, and also forming a second stacked film, wherein a second magnetization free layer, a second tunnel barrier layer, and a second magnetization fixed layer are sequentially stacked on the first stacked film; and etching the first stacked film and the second stacked film to form a first magnetic tunnel junction element on the first via while leaving a first stacked body which is one part of the first stacked film, and to form a third magnetic tunnel junction element on the first magnetic tunnel junction element while leaving a third stacked body which is one part of the second stacked film, and at the same time to form a second magnetic tunnel junction element on the second via while leaving a second stacked body which is other part of the first stacked film, left, and to form a fourth magnetic tunnel junction element on the second magnetic tunnel junction element while leaving a fourth stacked body which is other part of the second stacked film.

Embodiments of the invention will now be described with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be shown differently among the drawings, even for identical portions.

In the specification and the drawings of the application, components similar to those described in regard to a drawing thereinabove are marked with like reference numerals, and a detailed description is omitted as appropriate.

(First Embodiment)

FIGS. 1A to 1C are schematic cross sectional views illustrating the configuration of a memory device according to a first embodiment.

FIG. 2 is a schematic plan view illustrating the memory device according to the first embodiment.

Figure 3A:
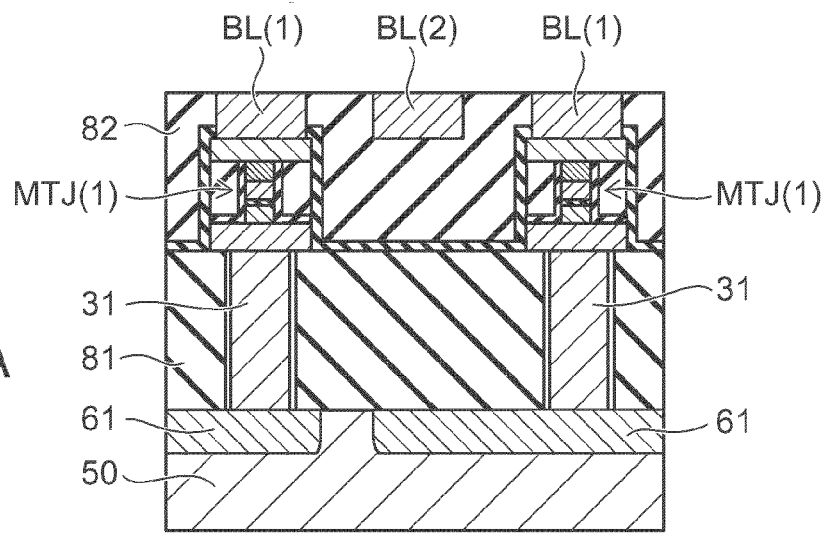
FIGS. 3A to 3C are schematic enlarged sectional views of a portion shown in FIG. 2.
Figure 3B:
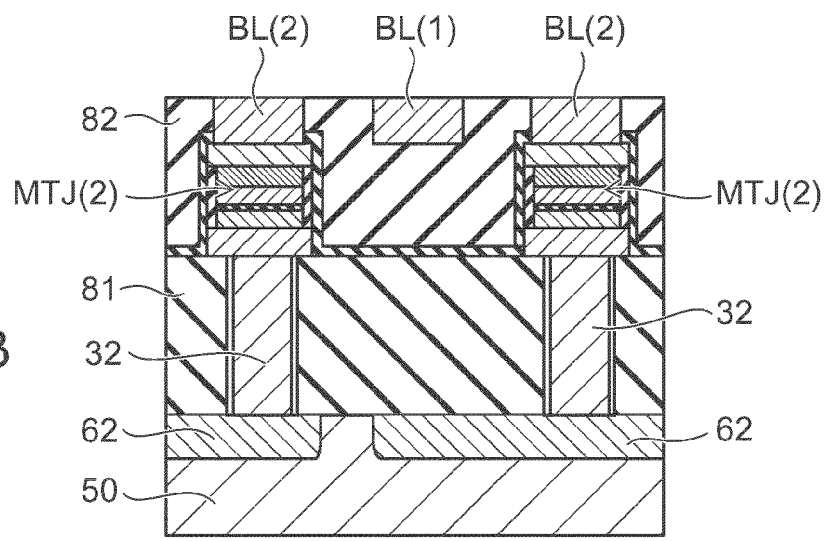
Figure 3C:
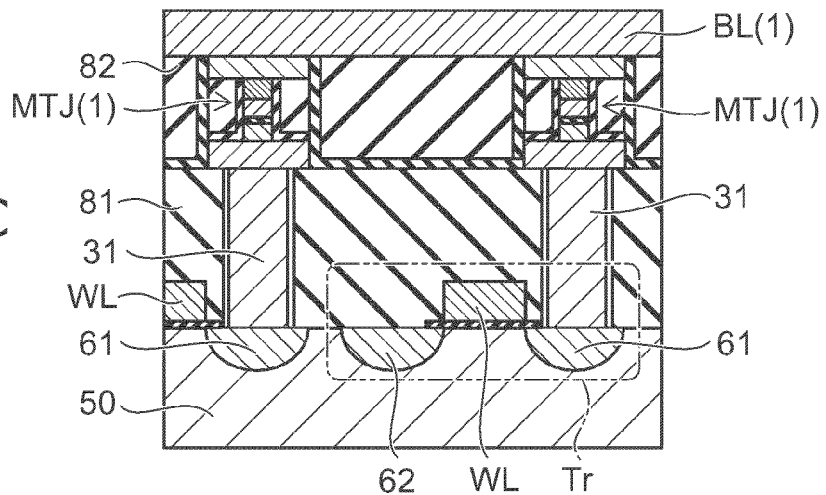

FIGS. 3A to 3C are schematic enlarged sectional views of a portion shown in FIG. 2.

Figure 4A:
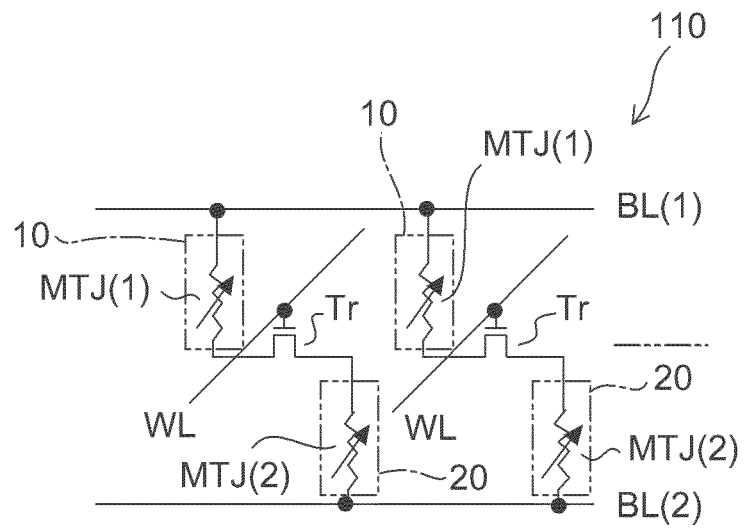
FIGS. 4A to 4B are views illustrating circuit configurations of the memory device.
Figure 4B:
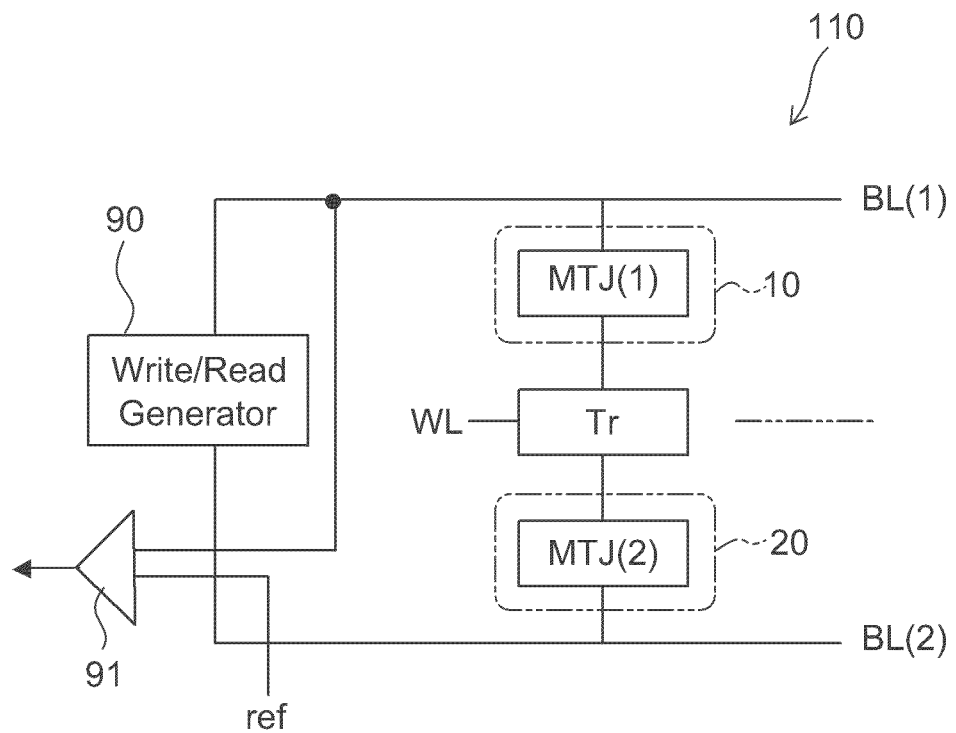

FIGS. 4A to 4B are views illustrating circuit configurations of the memory device.

FIG. 1A shows the cross section along an A-A line shown in FIG. 2. FIG. 3A shows the cross section along a B-B line shown in FIG. 2. FIG. 3B shows a C-C cross section shown in FIG. 2. FIG. 3C shows the cross section along a D-D line shown in FIG. 2. A memory device 110 according to the embodiment includes a first signal line BL(1), a second signal line BL(2), a transistor Tr, a first memory region 10, and a second memory region 20.

The first signal line BL(1) and the second signal line BL(2) are bit lines, for example.

The transistor Tr controls the conduction of each of a current in a first direction flowing between the first signal line BL(1) and the second signal line BL(2) and a current in a second direction opposite to the first direction. The transistor Tr is a MISFET (Metal Insulator Semiconductor Field effect transistor), for example.

In the embodiment, a direction d1 of a current flowing from the second signal line BL(2) toward the first signal line BL(1) via the transistor Tr will be referred to as the first direction, and a direction d2 opposite thereto will be referred to as the second direction.

FIG. 2 schematically shows a planar layout of the memory device 110.

As shown in FIG. 2, in the memory device 110, a plurality of first signal lines BL(1) and a plurality of second signal lines BL(2) are alternately disposed at equal intervals, for example. Here, in the embodiment, the direction in which the first signal line BL(1) and the second signal line BL(2) extend is referred to as an X-axis direction.

Among the plurality of first signal lines BL(1) and the plurality of second signal lines BL(2), a pair of adjacent first signal line BL(1) and second signal line BL(2) is a set and each set handles an independent signal.

The transistor Tr is provided between the pair of first signal line BL(1) and the second signal line BL(2). Between the pair of adjacent first signal line BL(1) and second signal line BL(2), a plurality of transistors Tr are disposed in parallel.

In the direction (Y-axis direction) perpendicular to the first signal line BL(1) and second signal line BL(2), a plurality of control lines WL are disposed. The control line WL is a word line, for example. With the control line WL as a gate electrode, the transistor Tr is provided at a position where the first signal line BL(1) and the second signal line BL(2) intersect the control line WL.

FIG. 1A shows the cross section centered on one transistor Tr among such a plurality of transistors Tr. In the memory device 110 according to the embodiment, the configuration centered on this one transistor Tr is regarded as one unit. Then, along the direction of the first signal line BL(1) and second signal line BL(2) and along the direction of the control line WL, a plurality of units are disposed in a matrix. Because the configuration of this unit in the memory device 110 is the same, one unit is mainly described in the following description.

As shown in a circuit diagram of FIG. 4A and a block diagram of FIG. 4B, between the first signal line BL(1) and one end of the transistor Tr, the first memory region 10 is connected. Moreover, between the second signal line BL(2) and the other end of the transistor Tr, the second memory region 20 is connected. Here, one end of the transistor Tr is a source or a drain of the transistor Tr. In the embodiment, the one end of the transistor Tr is the source. The other end of the transistor Tr is the drain or source of the transistor Tr. In the embodiment, the other end of the transistor Tr is the drain.

That is, the source side of the transistor Tr is connected to the first signal line BL(1) via the first memory region 10, and the drain side thereof is connected to the second signal line BL(2) via the second memory region 20. Thus, upon selection of the control line WL of the transistor Tr, the first memory region 10 and the second memory region 20 are connected in series between a pair of the first signal line BL(1) and the second signal line BL(2).

As shown in FIG. 1A, the first memory region 10 includes a first magnetic tunnel junction element MTJ(1), a magnetization direction of which becomes parallel when a current not less than a first parallel threshold value flows in the direction d1 and the magnetization direction of which becomes antiparallel when a current not less than a first antiparallel threshold value flows in the direction d2. Moreover, the second memory region 20 includes a second magnetic tunnel junction element MTJ(2), a magnetization direction of which becomes parallel when a current not less than a second parallel threshold value larger than the first parallel threshold value flows in the direction d2 and the magnetization direction of which becomes antiparallel when a current not less than a second antiparallel threshold value larger than the first antiparallel threshold value flows in the direction d1. The parallel threshold value and the antiparallel threshold value each are the threshold value of a current at which the magnetization direction of the magnetic tunnel junction element inverts, and this current value is referred to also as a "threshold value of magnetization inversion" in the embodiment.

FIG. 1B is a schematic cross sectional view illustrating the structure of the first magnetic tunnel junction element MTJ(1), and FIG. 1C is a schematic cross sectional view illustrating the structure of the second magnetic tunnel junction element MTJ(2).

The first magnetic tunnel junction element MTJ(1) includes a first stacked body ST1, wherein a first magnetization free layer 101(1), a first tunnel barrier layer 102(1), and a first magnetization fixed layer 103(1) are stacked in this order. Here, the stacking direction of these layers is referred to as a Z-axis direction. Moreover, in the Z-axis direction, the direction from the first magnetization free layer 101(1) toward the first magnetization fixed layer 103(1) is referred to also as an upward direction (upper side) and the direction opposite thereto is referred to also as downward direction (lower side).

In the first magnetic tunnel junction element MTJ(1), a first lower layer 104(1) is provided on the lower side of the first magnetization free layer 101(1), while on the upper side of the first magnetization fixed layer 103(1), a first upper conductive layer 105(1) is provided.

The first magnetization fixed layer 103(1) includes an antiferromagnetic layer or a ferromagnetic layer, and is provided so that the magnetization direction (direction of spin) is difficult to invert. On the other hand, the first magnetization free layer 101(1) includes a ferromagnetic layer, and is provided so that the magnetization direction is easy to invert.

In the first magnetic tunnel junction element MTJ(1), depending on whether the magnetization direction of the first magnetization free layer 101(1) with respect to the magnetization direction of the first magnetization fixed layer 103(1) is parallel or antiparallel, a change occurs in the resistance value of a tunnel current passing through the first tunnel barrier layer 102(1). Accordingly, in the first magnetic tunnel junction element MTJ(1), the magnetization direction of the first magnetization free layer 101(1) is controlled in accordance with the information desired to store, so that a change in the resistance value can be read utilizing the amount of a tunnel current and the stored information can be read.

Here, a state where the magnetization direction of the magnetization free layer (e.g., the first magnetization free layer 101(1)) is parallel to the magnetization direction of a magnetization fixed layer (e.g., the first magnetization fixed layer 103(1)) will be referred to as a parallel state (hereinafter, "P state"), and a state where it is antiparallel will be referred to as an antiparallel state (hereinafter, "AP state").

In the first magnetic tunnel junction element MTJ(1), when a current not less than the first parallel threshold value or a current not less than the first antiparallel threshold value flows between the first magnetization free layer 101(1) and the first magnetization fixed layer 103(1), the magnetization direction of the first magnetization free layer 101(1) will invert.

Specifically, when a current (i1P) not less than the first parallel threshold value flows from the first magnetization free layer 101(1) toward the first magnetization fixed layer 103(1), the magnetization direction of the first magnetization free layer 101(1) is put in the P state. That is, the first magnetic tunnel junction element MTJ(1) is put in the P state by the current (i1P) in the direction d1.

On the other hand, when a current (i1A) not less than the first antiparallel threshold value flows from the first magnetization fixed layer 103(1) toward the first magnetization free layer 101(1), the magnetization direction of the first magnetization free layer 101(1) is put in the AP state. That is, the first magnetic tunnel junction element MTJ(1) is put in the AP state by the current (i1A) in the direction d2.

Here, the current i1A is larger than the current i1P.

The second magnetic tunnel junction element MTJ(2) has the same structure as the first magnetic tunnel junction element MTJ(1). That is, a second magnetization free layer 101(2) corresponds to the first magnetization free layer 101(1), a second tunnel barrier layer 102(2) corresponds to the first tunnel barrier layer 102(1), and a second magnetization fixed layer 103(2) corresponds to the first magnetization fixed layer 103(1). Moreover, a second lower layer 104(2) corresponds to the first lower layer 104(1), and a second upper conductive layer 105(2) corresponds to the first upper conductive layer 105(1).

In the second magnetic tunnel junction element MTJ(2), when a current not less than the second parallel threshold value larger than the first parallel threshold value or a current not less than the second antiparallel threshold value larger than the first antiparallel threshold value flows between the second magnetization free layer 101(2) and the second magnetization fixed layer 103(2), the magnetization direction of the second magnetization free layer 101(2) will invert.

Specifically, when a current (i2P) not less than the second parallel threshold value flows from the second magnetization free layer 101(2) toward the second magnetization fixed layer 103(2), the magnetization direction of the second magnetization free layer 101(2) is put in the P state. That is, the second magnetic tunnel junction element MTJ(1) is put in the P state by the current (i2P) in the direction d2.

On the other hand, when a current (i2A) not less than the second antiparallel threshold value flows from the second magnetization fixed layer 103(2) toward the second magnetization free layer 101(2), the magnetization direction of the second magnetization free layer 101(2) is put in the AP state. That is, the second magnetic tunnel junction element MTJ(2) is put in the AP state by the current (i2A) in the direction d1.

Here, the current i1A is larger than the current i1P. The current i2A is larger than the current i2P.

The magnitude of each current satisfies a relation: the current i1P<current i1A<current i2P<current i2A.

In the memory device 110 according to the embodiment, by means of the above-described currents i1P, i1A, i2P, and i2A, the A state and the AP state of the first magnetic tunnel junction element MTJ(1) and the second magnetic tunnel junction element MTJ(2) are controlled to store multivalued information in the first memory region 10 and the second memory region 20. That is, binary information is stored according to whether the element is in the A state or the AP state, so that in the memory device 110 according to the embodiment, quaternary information can be stored according to the A state and the AP state of each of two magnetic tunnel junction elements (the first magnetic tunnel junction element MTJ(1) and the second magnetic tunnel junction element MTJ(2)).

Here, an example of the arrangement of each part of the memory device 110 according to the embodiment is described.

As shown in FIG. 1A, the transistor Tr is formed in a semiconductor substrate 50 made from silicon, for example. In the semiconductor substrate 50, a source region 61 and a drain region 62 of the transistor Tr are formed at a predetermined interval. On a major surface 50a of the semiconductor substrate 50, between the source region 61 and the drain region 62, the control line WL is provided via a gate insulating film 63. With the control line WL as a gate electrode, ON/OFF of the transistor Tr is controlled.

On the major surface 50a of the semiconductor substrate 50, an insulating film 81 covering the control line WL is provided. Above the source region 61 of the transistor Tr, a first via 31 penetrating through the insulating film 81 is provided. The first via 31 is conductive with the source region 61. On the other hand, above the drain region 62 of the transistor Tr, a second via 32 penetrating through the insulating film 81 is provided. The second via 32 is conductive with the drain region 62.

On the first via 31 is provided a first lower metal 41(1), on which the first magnetic tunnel junction element MTJ(1) is provided. Moreover, on the second via 32 is provided a second lower metal 41(2), on which the second magnetic tunnel junction element MTJ(2) is provided.

On the first magnetic tunnel junction element MTJ(1) is provided a first upper metal 42(1), on which the first signal line BL(1) is provided. Moreover, on the second magnetic tunnel junction element MTJ(2) is provided a second upper metal 42(2), on which the second signal line BL(2) is provided.

An insulating film 82 is provided around the first magnetic tunnel junction element MTJ(1) and the second magnetic tunnel junction element MTJ(2). The first signal line BL(1) and the second signal line BL(2) are exposed on the upper side of the insulating film 82.

Here, in order to change the threshold value of the magnetization inversion of the first magnetic tunnel junction element MTJ(1) and the second magnetic tunnel junction element MTJ(2), there are a method for changing the material of a layer constituting the first stacked body ST1 and the second stacked body ST2 and a method for changing the volume of the first magnetization free layer 101(1) and the second magnetization free layer 101(2).

In the embodiment, as one example, the threshold value of the magnetization inversion is changed by changing the volume of the first magnetization free layer 101(1) and the second magnetization free layer 101(2). The larger the volume of the first magnetization free layer 101(1) and the second magnetization free layer 101(2), the larger the threshold value of the magnetization inversion becomes.

In the embodiment, the first magnetization free layer 101(1) of the first stacked body ST1 and the second magnetization free layer 101(2) of the second stacked body ST2 are provided in the same thickness on the same plane. The materials of both layers are the same.

The first tunnel barrier layer 102(1) of the first stacked body ST1 and the second tunnel barrier layer 102(2) of the second stacked body ST2 are provided in the same thickness on the same plane. The materials of both layers are the same.

The first magnetization fixed layer 103(1) of the first stacked body ST1 and the second magnetization fixed layer 103(2) of the second stacked body ST2 are provided in the same thickness on the same plane. The materials of both layers are the same.

Therefore, by changing the area of an outside shape seen in the Z-axis direction of the first stacked body ST1 and the second stacked body ST2, the volume of the first magnetization free layer 101(1) and the second magnetization free layer 101(2) will change and the threshold value of the magnetization inversion can be changed.

As shown in FIG. 2, the outside shape seen in the Z-axis direction of the first magnetic tunnel junction element MTJ(1) and the second magnetic tunnel junction element MTJ(2), i.e., the outside shape seen in the Z-axis direction of the first stacked body ST1 and the second stacked body ST2 is circular. In the embodiment, a diameter D2 of the second magnetic tunnel junction element MTJ(2) is set larger than a diameter D1 of the first magnetic tunnel junction element MTJ(1). Thus, the volume of the second magnetization free layer 101(2) becomes larger than the volume of the first magnetization free layer 101(1), so that the threshold value of the magnetization inversion of the second magnetic tunnel junction element MTJ(2) can be set larger than the threshold value of the magnetization inversion of the first magnetic tunnel junction element MTJ(1).

As one specific example, the diameter D2 of the second magnetic tunnel junction element MTJ(2) is set approximately 1.5 times the diameter D1 of the first magnetic tunnel junction element MTJ(1).

Thus, the threshold value of the magnetization inversion of the second magnetic tunnel junction element MTJ(2) becomes approximately 2.25 times the threshold value of the magnetization inversion of the first magnetic tunnel junction element MTJ(1).

In the embodiment, because the diameter D2 is larger than the diameter D1, the resistance value in the P state of the second magnetic tunnel junction element MTJ(2) becomes smaller than the resistance value in the P state of the first magnetic tunnel junction element MTJ(1). In this manner, the resistance value in the P state of the first magnetic tunnel junction element MTJ(1) differs from the resistance value in the P state of the second magnetic tunnel junction element MTJ(2). Thereby, when only one of them is in the P state, which one is in the P state can be determined.

That is, when the same voltage is applied between the first signal line BL(1) and second signal line BL(2), a difference in current due to a difference in the resistance value occurs between when only the first magnetic tunnel junction element MTJ(1) is in the P state and when only the second magnetic tunnel junction element MTJ(2) is in the P state. Thus, which magnetic tunnel junction element is in the P state can be determined.

As described earlier, in the memory device 110 according to the embodiment, the layer structure of the first stacked body ST1 is the same as the layer structure of the second stacked body ST2. Accordingly, the first stacked body ST1 of the diameter D1 and the second stacked body ST2 of the diameter D2 can be formed by one-time etching after uniformly stacking the magnetization free layer, the tunnel barrier layer, and the magnetization fixed layer, respectively.

When the first stacked body ST1 and the second stacked body ST2 are formed in this manner, for example, the stacking order of the first stacked body ST1 and the stacking order of the second stacked body ST2 become opposite to each other along the direction d1 of a current flowing from the second signal line BL(2) to the first signal line BL(1). Accordingly, with regard to the direction d1 or d2 of the same current, one of the first magnetic tunnel junction element MTJ(1) and the second magnetic tunnel junction element MTJ(2) has the characteristic of changing from the P state to the AP state and the other one has the characteristic of changing from the AP state to the P state. Moreover, utilizing a difference in the threshold value of magnetization inversion in addition to the above-described characteristic, the P state and the AP state of the first magnetic tunnel junction element MTJ(1) and the second magnetic tunnel junction element MTJ(2) are controlled.

Next, the operation of the memory device 110 according to the embodiment is described.

As shown in FIG. 4B, a signal generator 90 and a sense amplifier 91 are provided as the peripheral circuit of the memory device 110. In the signal generator 90, a write voltage or a read voltage is applied between the first signal line BL(1) and second signal line BL(2).

To one input of the sense amplifier 91, for example, the voltage of the first signal line BL(1) is input, while to the other input, a reference voltage ref is input. The comparison result by the sense amplifier 91 is the readout value of the stored information.

Next, a specific example of the write operation of information is described.

When writing information, the signal generator 90 applies a voltage as a write voltage for feeding one of the currents i1A, i1P, i2A and i2P to between the first signal line BL(1) and the second signal line BL(2).

FIG. 5A to FIG. 6B are the schematic cross sectional views illustrating a specific write operation.

Figure 5A:
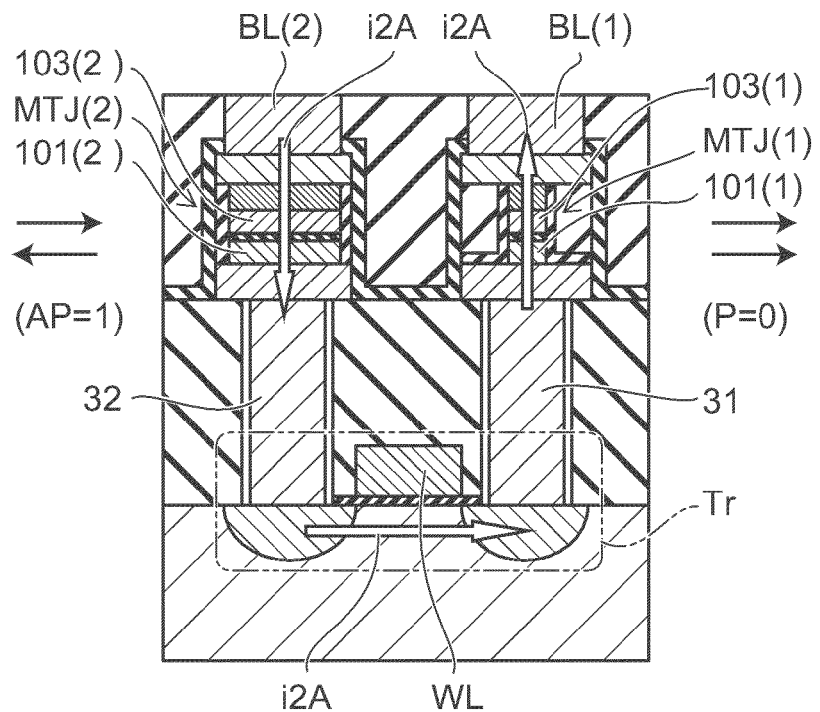
FIG. 5A to FIG. 6B are the schematic cross sectional views illustrating a specific write operation.

FIG. 5A illustrates the operation in selecting the control line WL of the transistor Tr and feeding the current i2A from the second signal line BL(2) to the first signal line BL(1).

In the second magnetic tunnel junction element MTJ(2), the current i2A flows from the second magnetization fixed layer 103(2) toward the second magnetization free layer 101(2). The current i2A exceeds the threshold value (second antiparallel threshold value) of the magnetization inversion of the second magnetic tunnel junction element MTJ(2). Accordingly, the second magnetic tunnel junction element MTJ(2) is put in the AP state because the current i2A flows.

On the other hand, in the first magnetic tunnel junction element MTJ(1), the current i2A flows from the first magnetization free layer 101(1) toward the first magnetization fixed layer 103(1). The current i2A exceeds the threshold value (first parallel threshold value) of the magnetization inversion of the first magnetic tunnel junction element MTJ(1). Accordingly, the first magnetic tunnel junction element MTJ(1) is put in the P state because the current i2A flows.

In the embodiment, it is assumed that the AP state is a bit "1" and the P state is a bit "0". It is assumed that the information stored in the first magnetic tunnel junction element MTJ(1) is the lower bit of 2 bits, for example, while the information stored in the second magnetic tunnel junction element MTJ(2) is the higher bit of 2 bits, for example.

Accordingly, in the operation illustrated in FIG. 5A, "10" in 2 bits is stored.

Figure 5B:
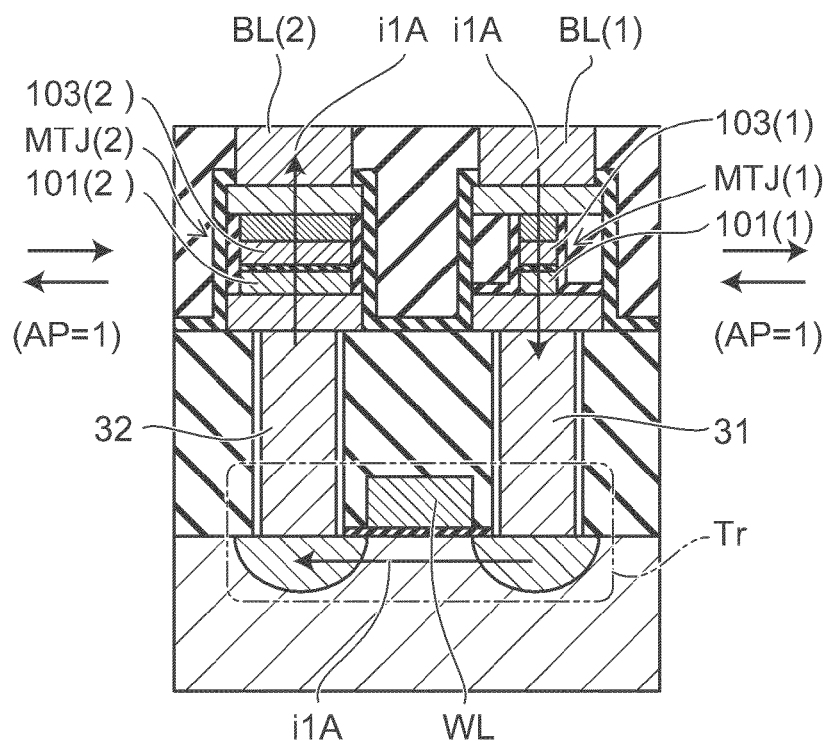

FIG. 5B illustrates the operation in selecting the control line WL of the transistor Tr and feeding the current i1A from the first signal line BL(1) to the second signal line BL(2).

In the first magnetic tunnel junction element MTJ(1), the current i1A flows from the first magnetization fixed layer 103(1) toward the first magnetization free layer 101(1). The current i1A exceeds the threshold value (first antiparallel threshold value) of the magnetization inversion of the first magnetic tunnel junction element MTJ(1). Accordingly, the first magnetic tunnel junction element MTJ(1) is put in the AP state because the current i1A flows.

On the other hand, in the second magnetic tunnel junction element MTJ(2), the current i1A flows from the second magnetization free layer 101(2) toward the first magnetization fixed layer 103(2). The current i1A is smaller than the threshold value (second parallel threshold value) of the magnetization inversion of the second magnetic tunnel junction element MTJ(2). Accordingly, in the second magnetic tunnel junction element MTJ(2), the magnetization is not inverted and the state is maintained. As shown in FIG. 5A, when the current i1A is fed after feeding the current i2A, the AP state is maintained.

Accordingly, in the operation illustrated in FIG. 5B, "11" in 2 bits will be stored.

Figure 6A:
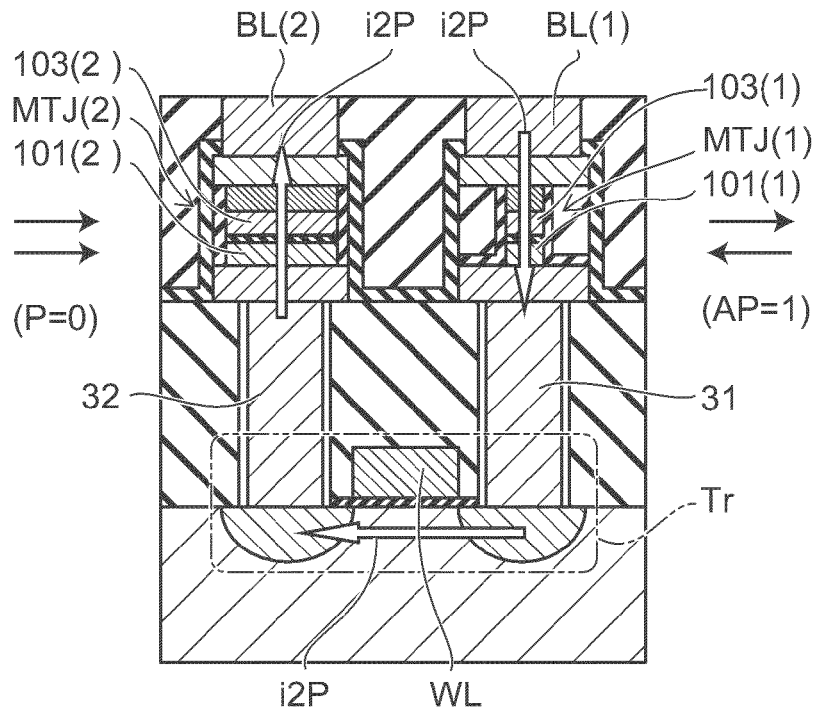

FIG. 6A illustrates the operation in selecting the control line WL of the transistor Tr and feeding the current i2P from the first signal line BL(1) to the second signal line BL(2).

In the first magnetic tunnel junction element MTJ(1), the current i2P flows from the first magnetization fixed layer 103(1) toward the first magnetization free layer 101(1). The current i2P exceeds the threshold value (first antiparallel threshold value) of the magnetization inversion of the first magnetic tunnel junction element MTJ(1). Accordingly, the first magnetic tunnel junction element MTJ(1) is put in the AP state because the current i2P flows.

On the other hand, in the second magnetic tunnel junction element MTJ(2), the current i2P flows from the second magnetization free layer 101(2) toward the second magnetization fixed layer 103(2). The current i2P exceeds the threshold value (second parallel threshold value) of the magnetization inversion of the second magnetic tunnel junction element MTJ(2). Accordingly, the second magnetic tunnel junction element MTJ(2) is put in the P state because the current i2P flows.

Accordingly, in the operation illustrated in FIG. 6A, "01" in 2 bits is stored.

Figure 6B:
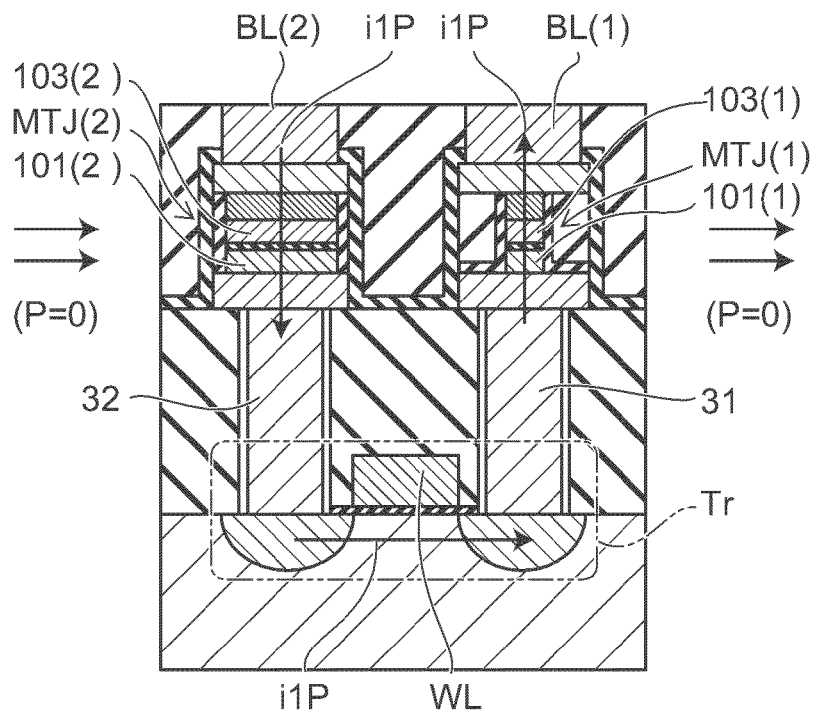

FIG. 6B illustrates the operation in selecting the control line WL of the transistor Tr and feeding the current i1P from the second signal line BL(2) to the first signal line BL(1).

In the second magnetic tunnel junction element MTJ(2), the current i1P flows from the second magnetization fixed layer 103(2) toward the second magnetization free layer 101(2). The current i1P is smaller than the threshold value (second antiparallel threshold value) of the magnetization inversion of the second magnetic tunnel junction element MTJ(2). Accordingly, in the second magnetic tunnel junction element MTJ(2), the magnetization is not inverted and the state is maintained. As shown in FIG. 6A, when the current i1P is fed after feeding the current i2P, the P state is maintained.

On the other hand, in the first magnetic tunnel junction element MTJ(1), the current i1P flows from the first magnetization free layer 101(1) toward the first magnetization fixed layer 103(1). The current i1P exceeds the threshold value (first parallel threshold value) of the magnetization inversion of the first magnetic tunnel junction element MTJ(1). Accordingly, the first magnetic tunnel junction element MTJ(1) is put in the P state because the current i1A flows.

Accordingly, in the operation illustrated in FIG. 6B, "00" in 2 bits will be stored.

Here, the write operation is summarized.

When storing "00", the current i1P is fed after feeding the current i2P.

When storing "01", the current i2P is fed.

When storing "10", the current i2A is fed.

When storing "11", the current i1A is fed after feeding the current i2A.

Next, a specific example of the read operation of information is described.

When reading information, the signal generator 90 applies a read voltage to between the first signal line BL(1) and the second signal line BL(2), as the read voltage. The read voltage is smaller than the smallest write voltage.

As shown in FIG. 4B, a total resistance value varies with a combination of the AP state and the P state of the first magnetic tunnel junction element MTJ(1) and the second magnetic tunnel junction element MTJ(2). Thus, the difference between the first signal line BL(1) and the reference voltage ref varies and the stored information can be determined.

Here, an example of the resistance value in the AP state and the P state of the first magnetic tunnel junction element MTJ(1) and the second magnetic tunnel junction element MTJ(2) is shown.

When the first magnetic tunnel junction element MTJ(1) is in the AP state, the resistance value is 7 kiloohms (kΩ), for example. Moreover, when the second magnetic tunnel junction element MTJ(2) is in the P state, the resistance value is 3 kΩ, for example. When an MR ratio (magnetoresistance change rate) of the first magnetic tunnel junction element MTJ(1) and the second magnetic tunnel junction element MTJ(2) is, for example, set to 200 percents (%), the total resistance value by the combination of the AP state and the P state of the first magnetic tunnel junction element MTJ(1) and the second magnetic tunnel junction element MTJ(2) is as follows.

In the case of "00", the total resistance value is 10 kΩ (parasitic resistance)

In the case of "10", the total resistance value is 16 kΩ.

In the case of "01", the total resistance value is 24 kΩ.

In the case of "11", the total resistance value is 30 kΩ.

The output of the sense amplifier 91 varies with the above-described total resistance value. Accordingly, the stored information can be determined according to the output of the sense amplifier 91. Note that, in the embodiment, a difference is provided between the resistance value in the AP state of the first magnetic tunnel junction element MTJ(1) and the resistance value in the AP state of the second magnetic tunnel junction element MTJ(2). For this reason, a difference occurs in the total resistance value between the case of "10" and the case of "01", and this difference can be determined by the output of the sense amplifier 91.

In this manner, the memory device 110 can handle multi-valued operation by means of the first magnetic tunnel junction element MTJ(1) and the second magnetic tunnel junction element MTJ(2). Moreover, a simple configuration can be realized by setting the layer structure of each of the first stacked body ST1 and the second stacked body ST2 to the same structure.

(Second Embodiment)

Next, a method for manufacturing the memory device 110 is described as a second embodiment.

FIG. 7A to FIG. 10B are the schematic cross sectional views illustrating the manufacturing method according to the embodiment.

Figure 7A:
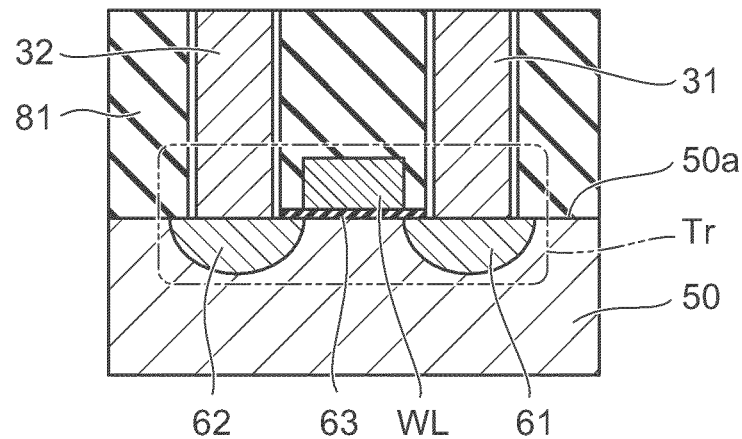
FIG. 7A to FIG. 10B are the schematic cross sectional views illustrating the manufacturing method according to the embodiment.

First, as shown in FIG. 7A, the transistor Tr is formed in the semiconductor substrate 50 utilizing a CMOS (Complementary Metal Oxide Semiconductor) process, for example. Thus, on the major surface 50a side of the semiconductor substrate 50 are formed the source region 61 and the drain region 62, and therebetween the control line WL is formed via the gate insulating film 63.

Next, the insulating film 81 is formed on the transistor Tr, and the first via 31 and the second via 32 penetrating through the insulating film 81 are formed on the source region 61 and the drain region 62. In order to form the first via 31 and the second via 32, first a through-hole is formed in the insulating film 81 and a barrier metal is formed in the inner wall of the through-hole, and thereafter tungsten (W) is embedded by CVD (Chemical Vapor Deposition), for example. Subsequently, the surface is planarized by CMP (Chemical Mechanical Polishing).

Figure 7B:
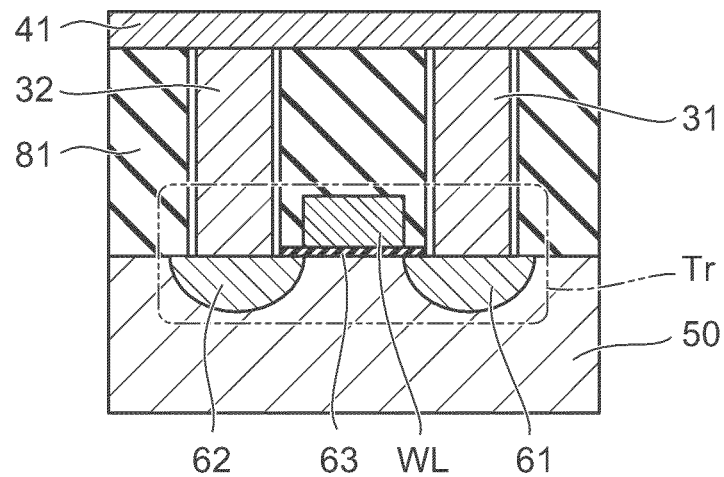

Next, as shown in FIG. 7B, a foundation metal layer 41 is formed on the planarized insulating film 81. In the foundation metal layer 41, tantalum (Ta) is used, for example. The surface roughness of the foundation metal layer 41 is not more than 0.2 nanometers (nm), for example.

Figure 8A:
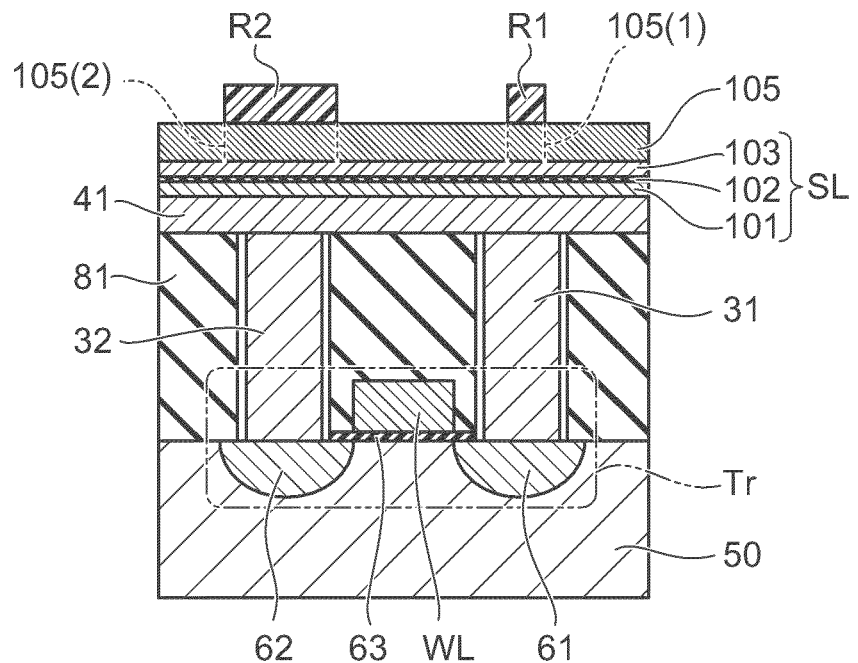

Next, as shown in FIG. 8A, on the foundation metal layer 41, a stacked film SL, wherein the magnetization free layer 101, the tunnel barrier layer 102, and the magnetization fixed layer 103 are sequentially stacked, is formed. Moreover, an upper conductive layer material 105 is formed on the stacked film SL. With regard to the upper conductive layer material, the stacked film SL and the upper conductive layer material 105 may be continuously deposited.

In the magnetization free layer 101, CoFeB is used, for example. In the tunnel barrier layer 102, MgO is used, for example. In the magnetization fixed layer 103, CoFeB is used, for example.

For example, $SiO_2$, SiN, Ta, $TiAl_xN_y$, TaN, TiN, WN, W, or $Al_2O_3$ is suitable as the upper conductive layer material 105. The upper conductive layer material 105 may be a single layer film using one of these materials or may be a stacked film using at least two of them.

Next, a resist is applied onto the upper conductive layer material 105, and resist patterns R1 and R2 are formed by photolithography. Then, with these resist patterns R1 and R2 as a mask, the upper conductive layer material 105 is etched. As the etching method, one of RIE (Reactive Ion Etching), IBE (Ion Beam Etching), and wet etching is used, for example. As required, the etching may be performed by a combination thereof. Portions left without being etched serve as the first upper conductive layer 105(1) and the second upper conductive layer 105(2).

The first upper conductive layer 105(1) and the second upper conductive layer 105(2) are used as a hard mask in the subsequent etching. Accordingly, the outside shape seen in the Z-axis direction of the first upper conductive layer 105(1) and the second upper conductive layer 105(2) corresponds to the outside shape of the first magnetic tunnel junction element MTJ(1) and the second magnetic tunnel junction element MTJ(2). With the outside shape of the first upper conductive layer 105(1) and the second upper conductive layer 105(2), the size of the first magnetic tunnel junction element MTJ(1) and the second magnetic tunnel junction element MTJ(2) can be set. In the embodiment, for example, the outside shape seen in the Z-axis direction of each of the first upper conductive layer 105(1) and the second upper conductive layer 105(2) is made circular, and the diameter of the second upper conductive layer 105(2) is set approximately 1.5 times the diameter of the first upper conductive layer 105(1).

Figure 8B:
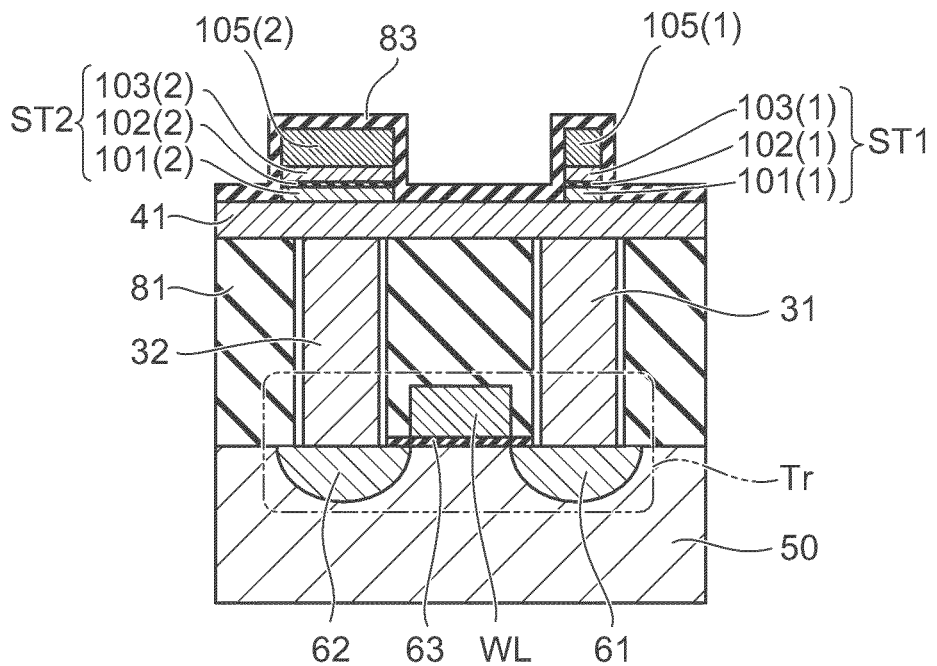

Subsequently, the stacked film SL is etched utilizing the first upper conductive layer 105(1) and the second upper conductive layer 105(2) as a hard mask layer. As the etching method, one of RIE, high temperature RIE (e.g., 150° C. to 300° C.) and IBE is used, for example. As required, the etching may be performed by a combination thereof. With this etching, as shown in FIG. 8B, the first stacked body ST1 that is a part of the remaining stacked film SL and the second stacked body ST2 that is other part of the remaining stacked film SL are formed. That is, on the lower side of the first upper conductive layer 105(1), the first stacked body ST1 comprising the first magnetization free layer 101(1), the first tunnel barrier layer 102(1), and the first magnetization fixed layer 103(1) is formed, while on the lower side of the second upper conductive layer 105(2), the second stacked body ST2 comprising the second magnetization free layer 101(2), the second tunnel barrier layer 102(2), and the second magnetization fixed layer 103(2) is formed. The area seen in the Z-axis direction of the first stacked body ST1 is smaller than the area seen in the Z-axis direction of the second stacked body ST2.

After forming the first stacked body ST1 and the second stacked body ST2, these are covered with a protection film 83. As the protection film 83, one of $Si_xN_y$, $Al_2O_3$, $Al_xO_y$ (oxygen rich: x=less than 2, y=3), $SiO_2$, $SiAl_xO_y$, $TiO_2$, and $ZrO_2$ or a combination of at least two thereof is used, for example. As the film forming method, for example, sputtering (including oblique incidence deposition), CVD, or ALD (Atomic Layer Deposition) is used. In the embodiment, as an example of the protection film 83, SiN is formed in the film thickness of 30 nm by sputtering (including oblique incidence deposition).

Figure 9A:
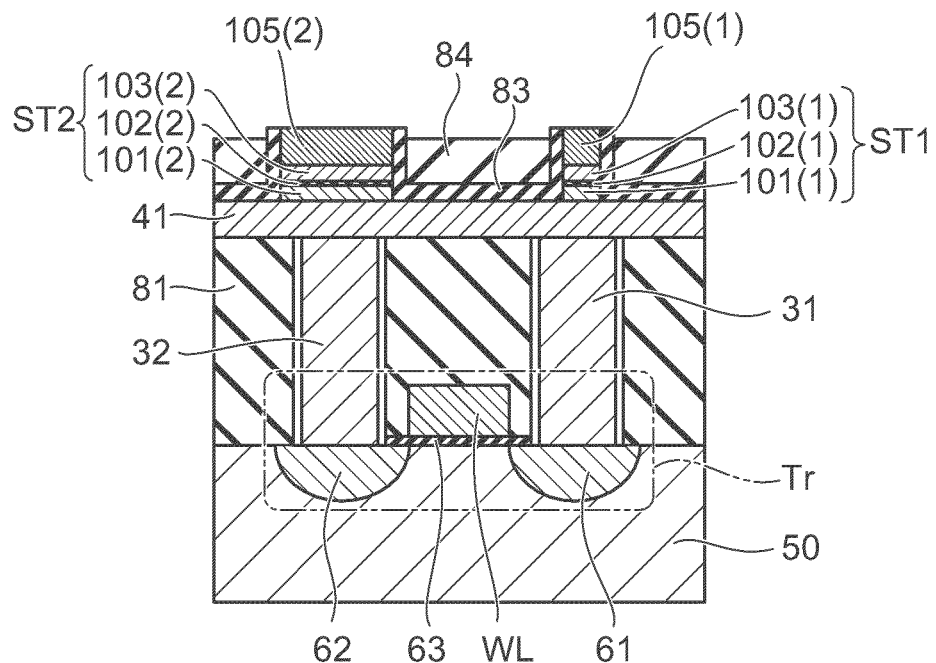

Next, as shown in FIG. 9A, an interlayer insulating film 84 is deposited and embedded in between the first stacked body ST1 and the second stacked body ST2. In the interlayer insulating film 84, $SiO_2$, SiOF, or SiOC is used, for example. Then, the interlayer insulating film 84 is planarized by CMP. After the planarization, the interlayer insulating film 84 is etched back to expose a part of the upper side of the first upper conductive layer 105(1) and the second upper conductive layer 105(2).

Figure 9B:
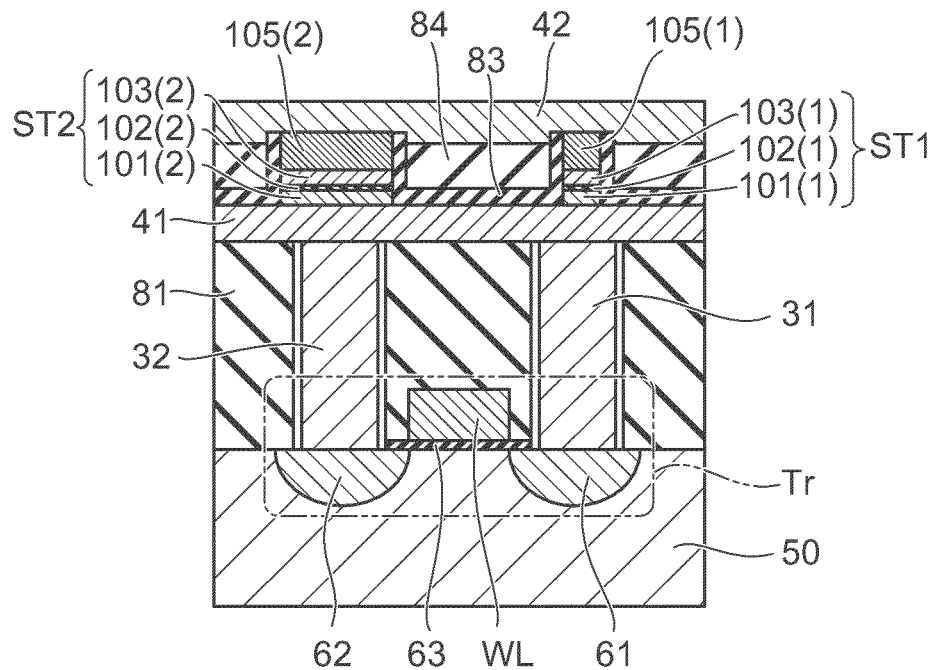

Next, as shown in FIG. 9B, on the exposed first upper conductive layer 105(1) and second upper conductive layer 105(2), an upper metallic material 42 is deposited to be in contact with the first upper conductive layer 105(1) and the second upper conductive layer 105(2). In the upper metallic material 42, Ti, Ta, TiN, W, or TaN is used, for example.

Figure 10A:
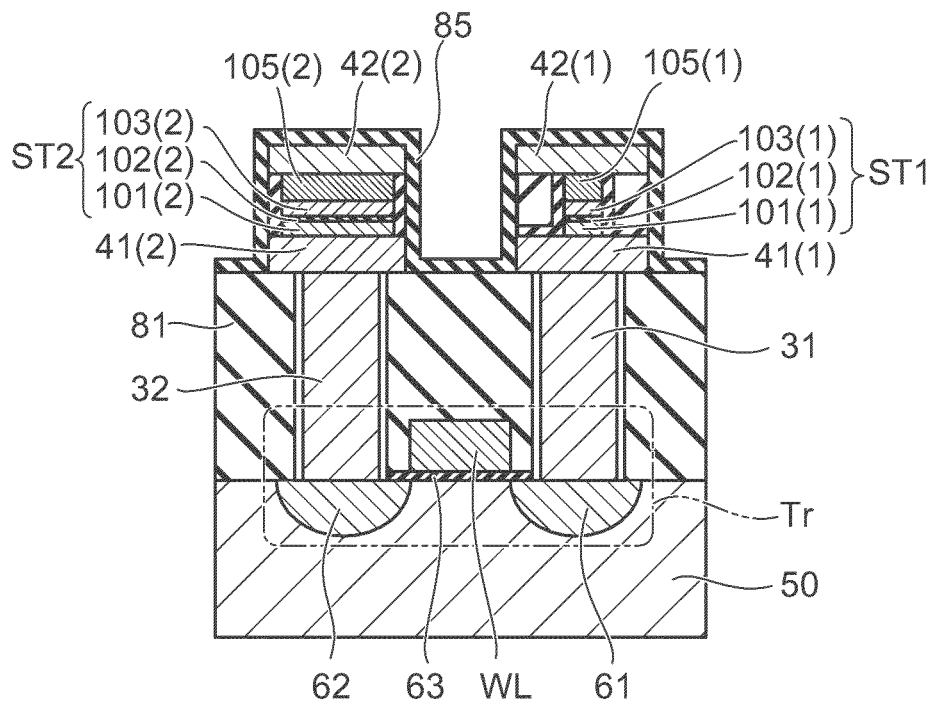

Next, by photolithography and etching, a part of the upper metallic material 42, the interlayer insulating film 84, and the foundation metal layer 41 is removed. Thus, as shown in FIG. 10A, the upper metallic material 42, the interlayer insulating film 84, and the foundation metal layer 41 other than the portion including the first stacked body ST1 and the second stacked body ST2 seen from the Z-axis direction are removed. Subsequently, a protection film 85 is deposited. The material of the protection film 85 is the same as the material of the protection film 83.

Figure 10B:
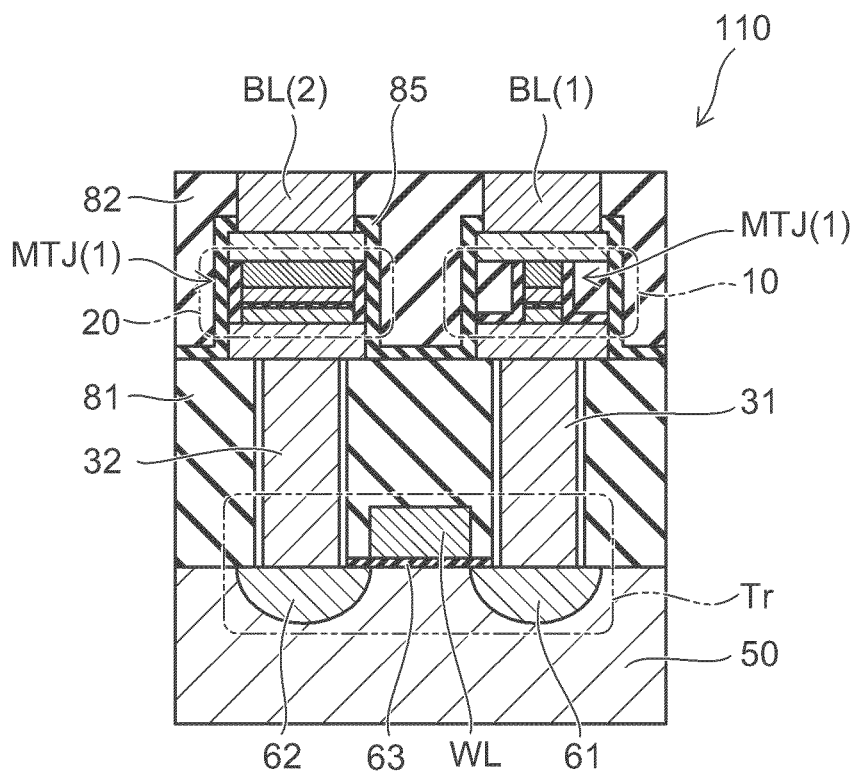

Next, as shown in FIG. 10B, after depositing the insulating film 82 on the protection film 85 and planarizing the surface thereof, the first signal line BL(1) and the second signal line BL(2) are formed by a damascene method using copper (Cu). Thus, between the first signal line BL(1) and the first via 31, the first memory region 10 with the first magnetic tunnel junction element MTJ(1) is formed, while between the second signal line BL(2) and the second via 32, the second memory region 20 with the second magnetic tunnel junction element MTJ(2) is formed.

With such processes, the memory device 110 is completed.

In the above-described manufacturing method, as with the processes shown in FIGS. 8A to 8B, after uniformly forming the magnetization free layer 101, the tunnel barrier layer 102, and the magnetization fixed layer 103, respectively, in this order, the first stacked body ST1 and the second stacked body ST2 each having a different size are collectively formed by etching. Accordingly, the manufacturing process can be simplified significantly as compared with the case where the first stacked body ST1 and the second stacked body ST2 each are manufactured in a separate process. Moreover, with the size of the first upper conductive layer 105(1) and the second upper conductive layer 105(2) that are utilized as a hard mask in etching, the size of the first stacked body ST1 and the second stacked body ST2 can be set easily and correctly, and the first magnetization free layer 101(1) and the second magnetization free layer 101(2) each having a different volume can be easily manufactured.

The memory device 110, as shown in FIG. 2, includes a plurality of first memory regions 10 (in FIG. 2, the regions where the first magnetic tunnel junction element MTJ(1) is shown), and a plurality of second memory regions 20 (in FIG. 2, the region where the second magnetic tunnel junction element MTJ(2) is shown).

The plurality of first memory regions 10 are disposed at the same pitch in each of the X-axis direction (row direction) and the Y-axis direction (column direction).

Moreover, the plurality of second memory regions 20 are disposed at the same pitch (the same pitch as the pitch of the first memory region 10) in each of the X-axis direction (row direction) and the Y-axis direction (column direction).

Then, the plurality of first memory regions 10 and the plurality of second memory regions 20 are disposed with a half pitch offset to each other in the X-axis direction and in the Y-axis directions.

With such a layout, a balance in the photolithography used in forming the first memory region 10 and the second memory region 20 is achieved. Accordingly, even if the size of the first memory region 10 differs from the size of the second memory region 20, the manufacturing variation can be suppressed and a stable product can be provided.

(Third Embodiment)

Figure 11:
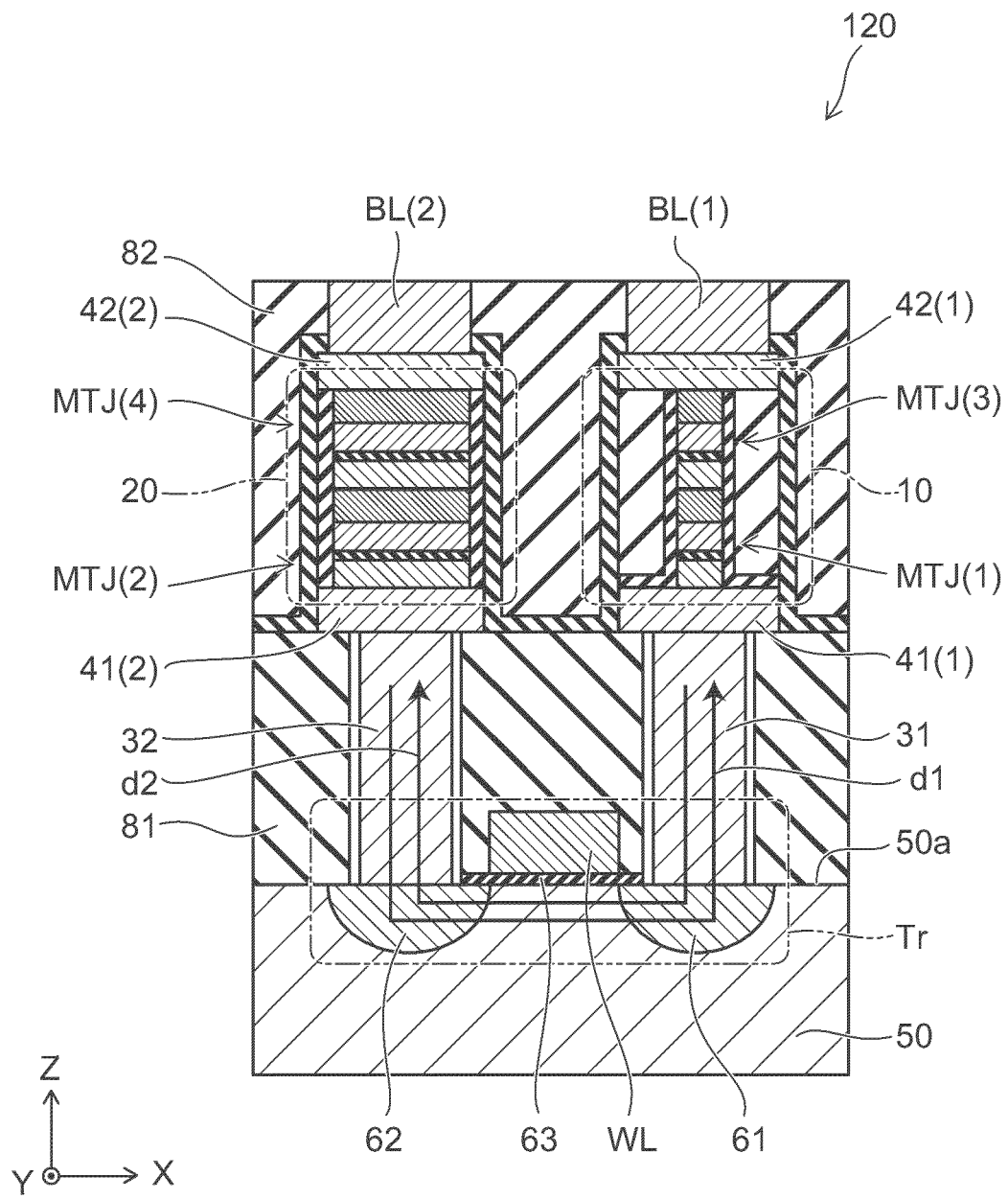
FIG. 11 is a schematic cross sectional view illustrating a memory device according to a third embodiment.

FIG. 11 is a schematic cross sectional view illustrating a memory device according to a third embodiment.

Figure 12A:
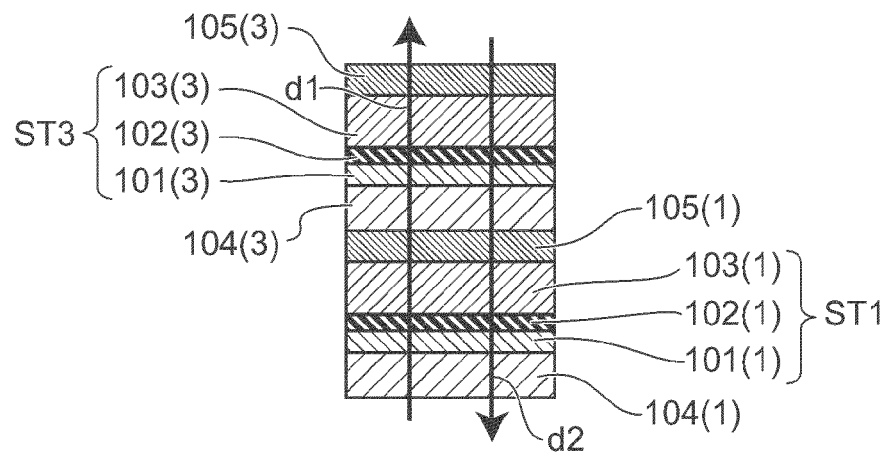
FIGS. 12A to 12B are schematic cross sectional views illustrating the layer structure of a memory region.
Figure 12B:
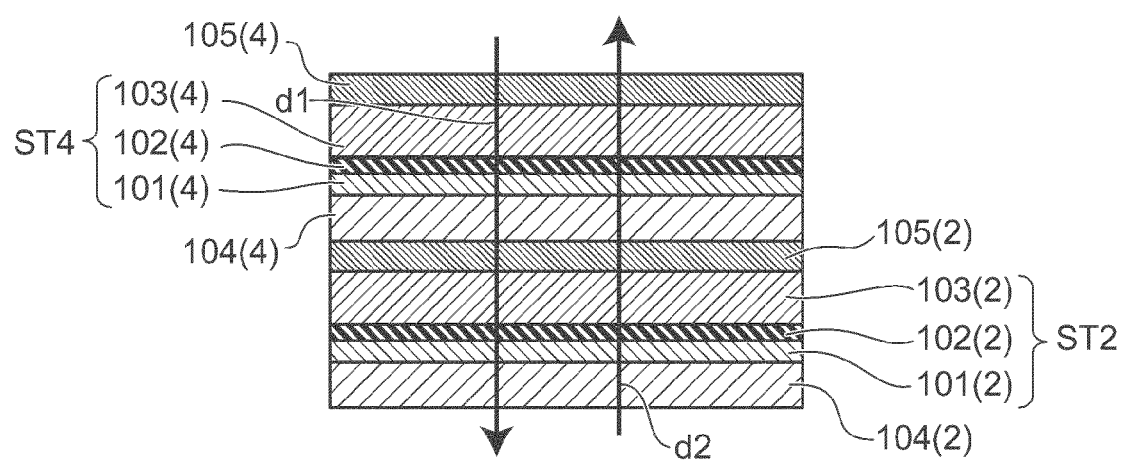

FIGS. 12A to 12B are schematic cross sectional views illustrating the layer structure of a memory region.

As shown in FIG. 11, in a memory device 120 according to the embodiment, the first magnetic tunnel junction element MTJ(1) and a third magnetic tunnel junction element MTJ(3) are provided in the first memory region 10, while in the second memory region 20, the second magnetic tunnel junction element MTJ(2) and a fourth magnetic tunnel junction element MTJ(4) are provided.

The third magnetic tunnel junction element MTJ(3) is provided between the first signal line BL(1) and the first magnetic tunnel junction element MTJ(1). In the third magnetic tunnel junction element MTJ(3), the magnetization direction becomes parallel when a current not less than a third parallel threshold value smaller than the first parallel threshold value flows in the direction d1, and the magnetization direction becomes antiparallel when a current not less than a third antiparallel threshold value smaller than the first antiparallel threshold value flows in the direction d2.

As shown in FIG. 12A, the third magnetic tunnel junction element MTJ(3) is stacked on the first magnetic tunnel junction element MTJ(1).

The third magnetic tunnel junction element MTJ(3) includes a third stacked body ST3, wherein a third magnetization free layer 101(3), a third tunnel barrier layer 102(3), and a third magnetization fixed layer 103(3) are stacked in this order. Moreover, a third lower layer 104(3) is provided on the lower side of the third magnetization free layer 101(3), while on the upper side of the third magnetization fixed layer 103(3), a third upper conductive layer 105(3) is provided.

The stacking order of the third stacked body ST3 in the third magnetic tunnel junction element MTJ(3) is the same as the stacking order of the first stacked body ST1 in the first magnetic tunnel junction element MTJ(1). That is, in the first stacked body ST1, from bottom to top, the first magnetization free layer 101(1), the first tunnel barrier layer 102(1), and the first magnetization fixed layer 103(1) are stacked in this order, and also in the third stacked body ST3, these layers are stacked in the same order.

In this manner, a structure, wherein the first stacked body ST1 and the third stacked body ST3 are stacked, is provided between the first lower metal 41(1) and the first upper metal 42(1).

The size of the outside shape seen in the Z-axis direction of the first stacked body ST1 is the same as the size of the outside shape seen in the Z-axis direction of the third stacked body ST3. Accordingly, in order to change the threshold value of the magnetization inversion of the first magnetic tunnel junction element MTJ(1) and the second magnetic tunnel junction element MTJ(3), there are a method for changing the material of a layer constituting the first stacked body ST1 and third stacked body ST3 and a method for changing the thickness of the magnetization free layer. With at least one of these methods, the threshold value of the magnetization inversion of the third magnetic tunnel junction element MTJ(3) is set so as to be smaller than the threshold value of the magnetization inversion of the first magnetic tunnel junction element MTJ(1).

In such a structure of the first memory region 10, for example, along the direction d1 of a current flowing from the second signal line BL(2) to the first signal line BL(1), the stacking order of the first stacked body ST1 becomes the same as the stacking order of the third stacked body ST3. Accordingly, the state change of the A state and the P state with respect to the direction of the current is the same between the first magnetic tunnel junction element MTJ(1) and the third magnetic tunnel junction element MTJ(3). Moreover, utilizing a difference in the threshold value of magnetization inversion in addition to the above-described characteristic, the P state and the AP state of the first magnetic tunnel junction element MTJ(1) and the second magnetic tunnel junction element MTJ(3) are controlled.

The fourth magnetic tunnel junction element MTJ(4) is provided between the second signal line BL(2) and the second magnetic tunnel junction element MTJ(2). In the fourth magnetic tunnel junction element MTJ(4), when a current not less than a fourth parallel threshold value smaller than the second parallel threshold value flows in the direction d2, the magnetization direction becomes parallel, while when a current not less than a fourth antiparallel threshold value smaller than the second antiparallel threshold value flows in the direction d1, the magnetization direction becomes antiparallel.

As shown in FIG. 12B, the fourth magnetic tunnel junction element MTJ(4) is stacked on the second magnetic tunnel junction element MTJ(2).

The fourth magnetic tunnel junction element MTJ(4) includes a fourth stacked body ST4, wherein a fourth magnetization free layer 101(4), a fourth tunnel barrier layer 102(4), and a fourth magnetization fixed layer 103(4) are stacked in this order. Moreover, a fourth lower layer 104(4) is provided on the lower side of the fourth magnetization free layer 101(4), while on the upper side of the fourth magnetization fixed layer 103(4), a fourth upper conductive layer 105(4) is provided.

The stacking order of the fourth stacked body ST4 in the fourth magnetic tunnel junction element MTJ(4) is the same as the stacking order of the second stacked body ST2 in the second magnetic tunnel junction element MTJ(2). That is, in the second stacked body ST2, from bottom to top, the second magnetization free layer 101(2), the second tunnel barrier layer 102(2), and the second magnetization fixed layer 103(2) are stacked in this order, and also in the fourth stacked body ST4, these layers are stacked in the same order.

In this manner, a structure, wherein the second stacked body ST2 and the fourth stacked body ST4 are stocked, is provided between the second lower metal 41(2) and the second upper metal 42(2).

The size of the outside shape seen in the Z-axis direction of the second stacked body ST2 is the same as the size of the outside shape seen in the Z-axis direction of the fourth stacked body ST4. Accordingly, in order to change the threshold value of the magnetization inversion of the second magnetic tunnel junction element MTJ(2) and the fourth magnetic tunnel junction element MTJ(4), there are a method for changing the material of a layer constituting the second stacked body ST2 and fourth stacked body ST4 and a method for changing the thickness of the magnetization free layer. With at least one of these methods, the threshold value of the magnetization inversion of the fourth magnetic tunnel junction element MTJ(4) is set so as to be smaller than the threshold value of the magnetization inversion of the second magnetic tunnel junction element MTJ(2).

In such a structure of the second memory region 20, for example, along the direction d1 of a current flowing from the second signal line BL(2) to the first signal line BL(1), the stacking order of the second stacked body ST2 becomes the same as the stacking order of the fourth stacked body ST4. Accordingly, the state change of the A state and the P state with respect to the direction of the current is the same between the second magnetic tunnel junction element MTJ(2) and the fourth magnetic tunnel junction element MTJ(4). Moreover, utilizing a difference in the threshold value of magnetization inversion in addition to the above-described characteristic, the P state and the AP state of the second magnetic tunnel junction element MTJ(2) and the fourth magnetic tunnel junction element MTJ(4) are controlled.

In this manner, by employing a structure, wherein in the first memory region 10, the first magnetic tunnel junction element MTJ(1) and the third magnetic tunnel junction element MTJ(3) are stacked, while in the second memory region 20, the second magnetic tunnel junction element MTJ(2) and the fourth magnetic tunnel junction element MTJ(4) are stacked, a configuration for storing 4 bits of information can be realized in the memory device 120.

Note that, in the memory device 120 shown in FIG. 11, a configuration, wherein the magnetic tunnel junction elements are stacked, is applied both to the first memory region 10 and to the second memory region 20, but a structure, wherein the magnetic tunnel junction elements are stacked, may be applied to only either one of the first memory region 10 and the second memory region 20. Moreover, in each of the first memory region 10 and the second memory region 20, the number of magnetic tunnel junction elements to stack may be not less than three.

(Fourth Embodiment)

Next, a method for manufacturing the memory device 120 is described as a fourth embodiment.

FIG. 13A to FIG. 15B are the schematic cross sectional views illustrating the manufacturing method according to the embodiment.

Figure 13A:
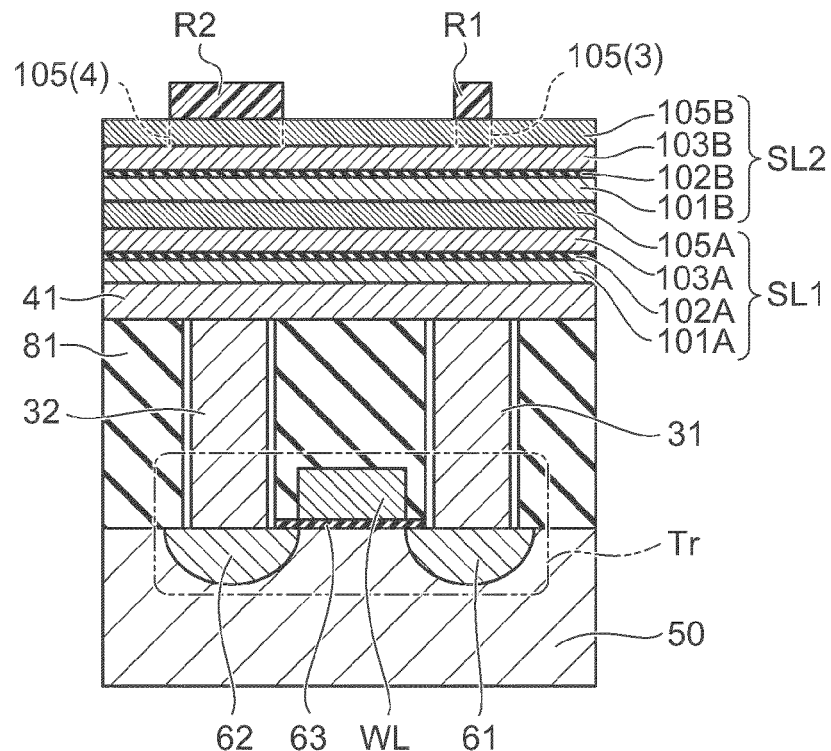
FIG. 13A to FIG. 15B are the schematic cross sectional views illustrating the manufacturing method according to the embodiment.

Here, forming the transistor Tr into the semiconductor substrate 50 shown to FIG. 13A, forming the control line WL via the gate insulating film 63, forming the insulating film 81, forming the first via 31 and the second via 32, and forming the foundation metal layer 41 are the same as in the processes shown in FIGS. 7 to 8.

Next, a first stacked film SL1, wherein a magnetization free layer 101A, a tunnel barrier layer 102A, a magnetization fixed layer 103A, and an upper conductive layer material 105A are sequentially stacked, is formed on the foundation metal layer 41, while on the first stacked film SL1, a second stacked film SL2, wherein a magnetization free layer 101B, a tunnel barrier layer 102B, a magnetization fixed layer 103B, and an upper conductive layer material 105B are sequentially stacked, is formed. In the embodiment, the materials of the magnetization free layers 101A and 101B differ from ach other, the materials of the tunnel barrier layers 102A and 102B differ from ach other, and the materials of the magnetization fixed layers 103A and 103B differ from ach other, For example, CoFeB is used in the magnetization free layer 101A, and Co is used in the magnetization free layer 101B. MgO is used in the tunnel barrier layer 102A, and MgO is used in the tunnel barrier layer 102B. CoFeB is used in the magnetization fixed layer 103A, and CoFeB is used in the magnetization fixed layer 103B.

By using different materials in this manner, the threshold values of the magnetization inversion of two magnetic tunnel junction elements stacked can be varied.

Next, a resist is applied onto the upper conductive layer material 105B, and the resist patterns R1 and R2 are formed by photolithography. Then, with these resist patterns R1 and R2 as a mask, the upper conductive layer material 105B is etched. As the etching method, one of RIE, IBE, and wet etching is used, for example. As required, the etching may be performed by a combination thereof. Portions left without being etched serve as the third upper conductive layer 105(3) and the fourth upper conductive layer 105(4).

Figure 13B:
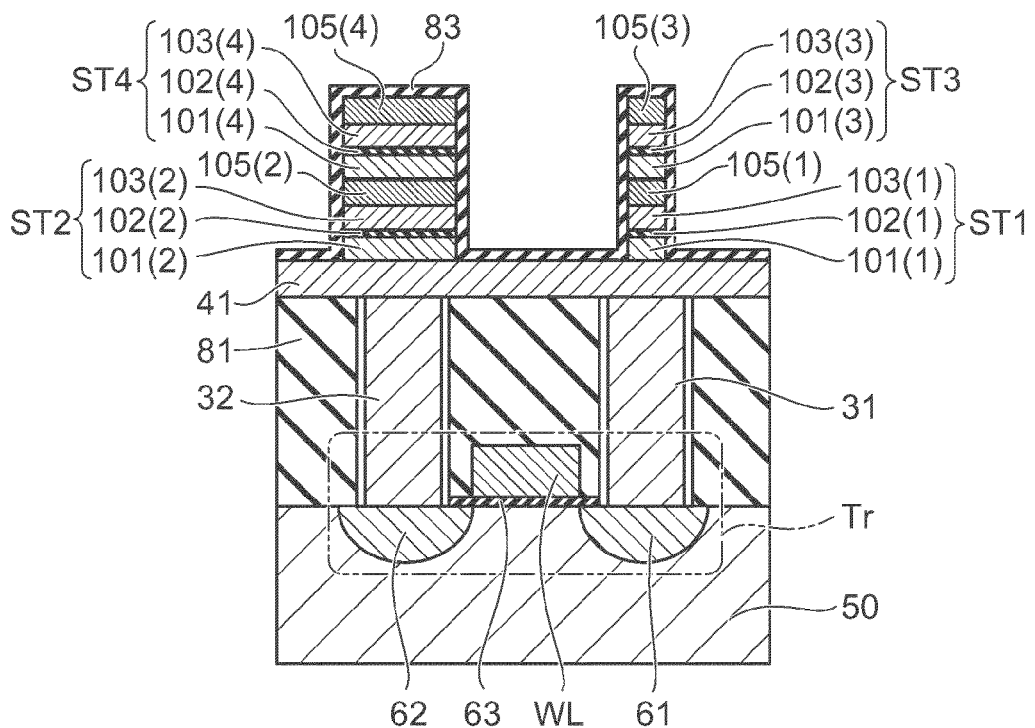

Next, utilizing the third upper conductive layer 105(3) and the fourth upper conductive layer 105(4) as a hard mask layer, the first stacked film SL1 and the second stacked film SL2 are etched. As the etching method, for example, one of RIE, high temperature RIE (e.g., 150° C. to 300° C.) and IBE is used. As required, the etching may be performed with a combination thereof. With this etching, as shown in FIG. 13B, the first stacked body ST1, the second stacked body ST2, the third stacked body ST3, and the fourth stacked body ST4 are formed.

That is, the first stacked body ST1 is formed with a part of the first stacked film SL1 left on the first via 31, and the third stacked body ST3 is formed with a part of the second stacked film SL2 left on the first stacked body ST1. Moreover, the 2d stacked body ST2 is formed with other part of the first stacked film SL1 left on the second via 32, and the fourth stacked body ST4 is formed with other part of the second stacked film SL2 left on the second stacked body ST2.

Thus, the third stacked body ST3 is stacked on the first stacked body ST1, and the fourth stacked body ST4 is stacked on the second stacked body ST2.

By collective etching of the first stacked film SL1 and the second stacked film SL2 via the resist pattern R1, the outside shape seen in the Z-axis direction of the first stacked body ST1 becomes the same as the outside shape seen in the Z-axis direction of the third stacked body ST3. Moreover, by collective etching of the first stacked film SL1 and the second stacked film SL2 via the resist pattern R2, the outside shape seen in the Z-axis direction of the second stacked body ST2 becomes the same as the outside shape seen in the Z-axis direction of the fourth stacked body ST4.

Moreover, depending on the area of each of the resist patterns R1 and R2, the area seen in the Z-axis direction of the first stacked body ST1 becomes smaller than the area seen in the Z-axis direction of the second stacked body ST2. Similarly, the area seen in the Z-axis direction of the third stacked body ST3 becomes smaller than the area seen in the Z-axis direction of the fourth stacked body ST4.

After forming the first stacked body ST1, the second stacked body ST2, the third stacked body ST3, and the fourth stacked body ST4, these are covered with the protection film 83.

Figure 14A:
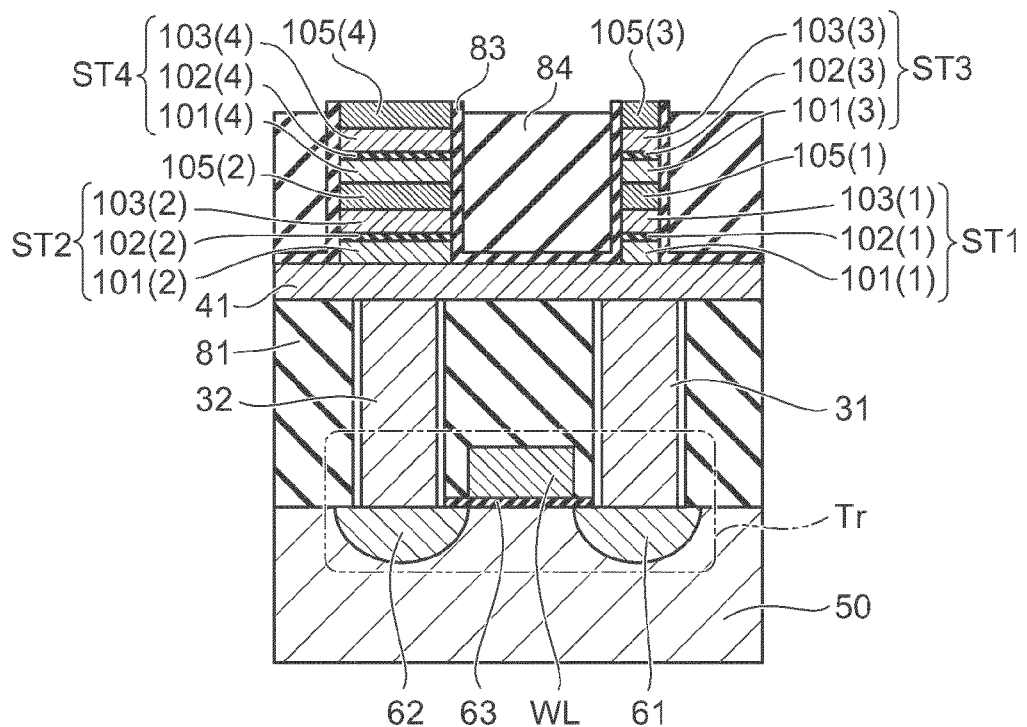

Next, as shown in FIG. 14A, the interlayer insulating film 84 is deposited, and embedded in between the first stacked body ST1 and the second stacked body ST2 and in between the third stacked body ST3 and the fourth stacked body ST4. Then, the interlayer insulating film 84 is planarized by CMP. Moreover, after the planarization, the interlayer insulating film 84 is etched back to expose a part of the upper side of the first upper conductive layer 105(3) and the second upper conductive layer 105(4).

Figure 14B:
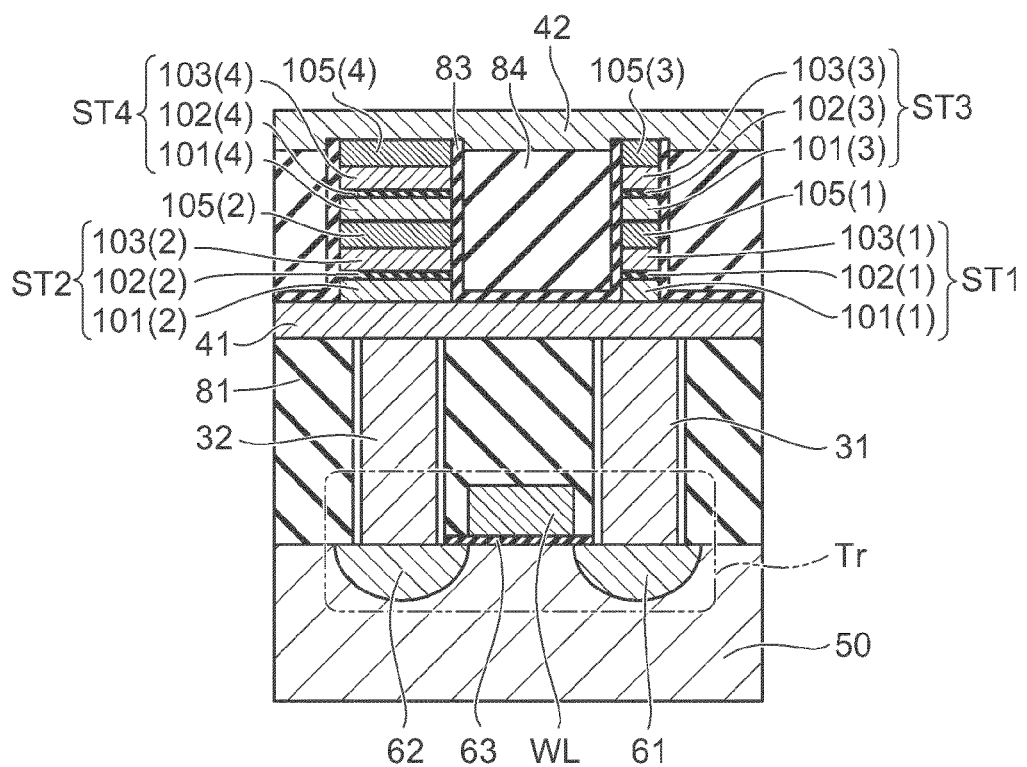

Next, as shown in FIG. 14B, the upper metallic material 42 is deposited onto the exposed third upper conductive layer 105(3) and fourth upper conductive layer 105(4) to be in contact with the third upper conductive layer 105(3) and the fourth upper conductive layer 105(4).

Figure 15A:
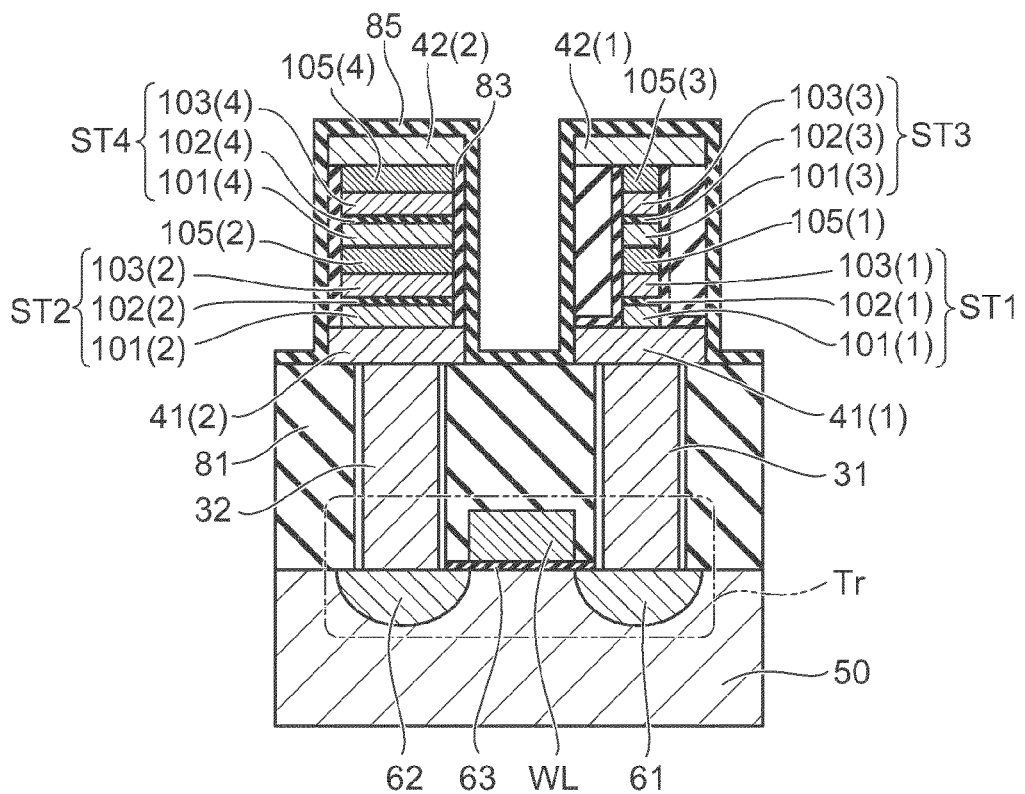

Next, by photolithography and etching, a part of the upper metallic material 42, the interlayer insulating film 84, and the foundation metal layer 41 is removed. Thus, as shown in FIG. 15A, seen from the Z-axis direction, the upper metallic materials 42, the interlayer insulating films 84, and the foundation metal layers 41 other than the portions including the first stacked body ST1, the second stacked body ST2, the third stacked body ST3, and the fourth stacked body ST4 are removed. Subsequently, the protection film 85 is deposited. The material of the protection film 85 is the same as the material of the protection film 83.

Figure 15B:
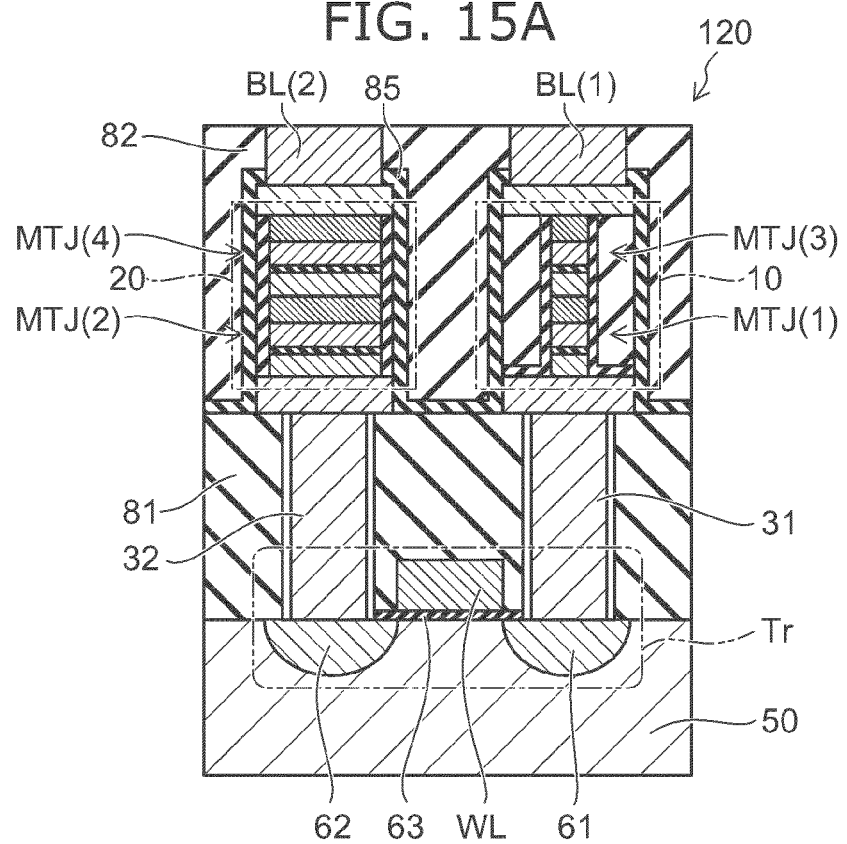

Next, as shown in FIG. 15B, after depositing the insulating film 82 onto the protection film 85 and planarizing the surface, the first signal line BL(1) and the second signal line BL(2) are formed by a damascene method using copper (Cu). Thus, between the first signal line BL(1) and the first via 31, the first memory region 10 including the first magnetic tunnel junction element MTJ(1) and the third magnetic tunnel junction element MTJ(3) is formed, while between the second signal line BL(2) and the second via 32, the second memory region 20 including the second magnetic tunnel junction element MTJ(2) and the fourth magnetic tunnel junction element MTJ(4) is formed. With such processes, the memory device 120 is completed.

In the above-described manufacturing method, as with the processes shown in FIGS. 13A to 13B, after uniformly depositing the magnetization free layer 101A, the tunnel barrier layer 102A, the magnetization fixed layer 103A, the magnetization free layer 101B, the tunnel barrier layer 102B, and the magnetization fixed layer 103B, a stacked structure of the first stacked body ST1 and the third stacked body ST3 and a stacked structure of the second stacked body ST2 and the fourth stacked body ST4 are collectively formed by etching. Accordingly, the manufacturing process can be simplified significantly as compared with the case where these stacked bodies and stacked structures each are manufactured in a separate process. Moreover, with the size of the third upper conductive layer 105(3) and the fourth upper conductive layer 105(4) used as a hard mask in etching, the size of the first stacked body ST1 and the third stacked body ST3 as well as the size of the second stacked body ST2 and the fourth stacked body ST4 can be easily and correctly set.

Next, the operation of the memory device 120 according to the embodiment is described.

Figure 16:
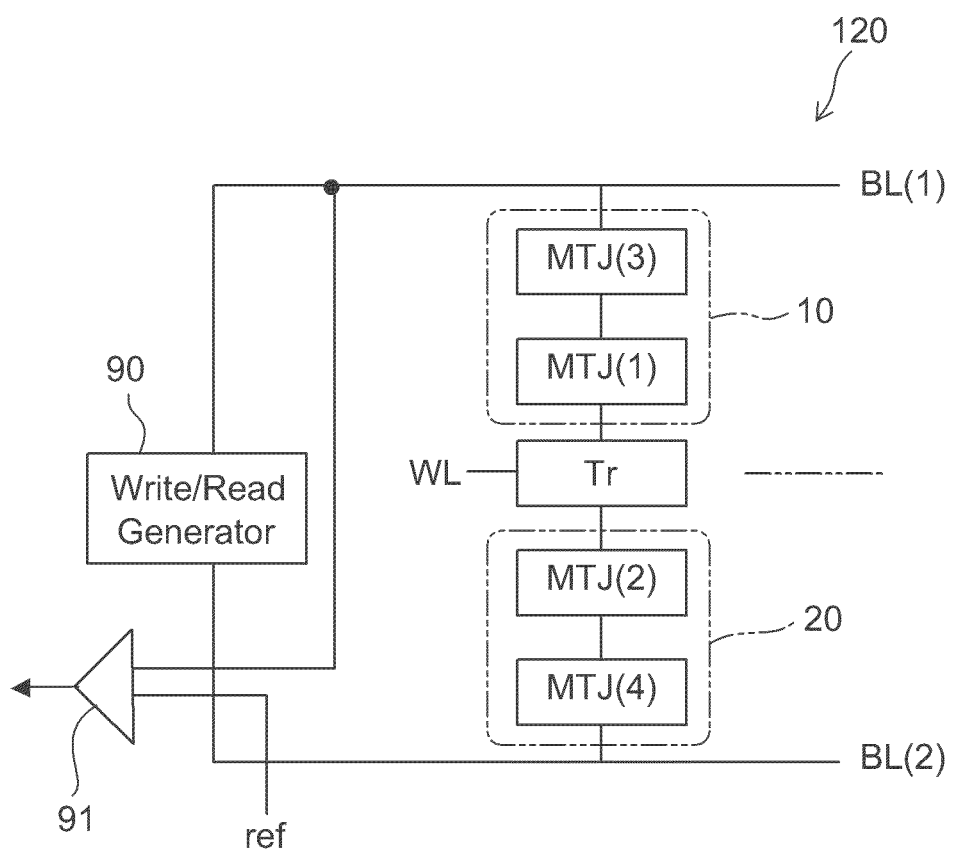
FIG. 16 is a block diagram illustrating the memory device and the peripheral circuit thereof.

FIG. 16 is a block diagram illustrating the memory device and the peripheral circuit thereof.

FIG. 17A to FIG. 18H are schematic cross sectional views illustrating a specific write operation.

FIGS. 17 to 18 schematically show the first magnetic tunnel junction element MTJ(1) to the fourth magnetic tunnel junction element MTJ(4), the direction of current, the A state and the AP state in the memory device 120.

As shown in FIG. 16, as the peripheral circuit of the memory device 120, a signal generator 90 and a sense amplifier 91 are provided. In the first memory region 10 provided between the transistor Tr and the first signal line BL(1), the first magnetic tunnel junction element MTJ(1) is provided on the transistor Tr side, while on the first signal line BL(1) side, the third magnetic tunnel junction element MTJ(3) is provided. Moreover, in the second memory region 20 provided between the transistor Tr and the second signal line BL(2), the second magnetic tunnel junction element MTJ(2) is provided on the transistor Tr side, while on the second signal line BL(2) side, the fourth magnetic tunnel junction element MTJ(4) is provided.

Next, a specific example of the write operation of information is described.

When writing information, the signal generator 90 applies a voltage, as the write voltage, for feeding one of currents i1A, i1P, i2A, i2P, i3A, i3P, i4A and i4P between the first signal line BL(1) and the second signal line BL(2).

Here, the current i3A is a current for setting the third magnetic tunnel junction element MTJ(3) into the AP state.

The current i3A has a value not less than the third antiparallel threshold value.

The current i3P is a current for setting the third magnetic tunnel junction element MTJ(3) into the P state. The current i3P has a value not less than the third parallel threshold value.

The current i4A is a current for setting the fourth magnetic tunnel junction element MTJ(4) into the A state. The current i4A has a value not less than the fourth antiparallel threshold value.

The current i4P is a current for setting the fourth magnetic tunnel junction element MTJ(4) into the P state. The current i4P has a value not less than the fourth parallel threshold value.

The current i3A is larger than the current i3P. The current i4A is larger than the current i4P.

The magnitude of each current has a relation: $i3P < i3A < i1P < i1A < i4P < i4A < i2P < i2A$.

Figures 17A, 17B:
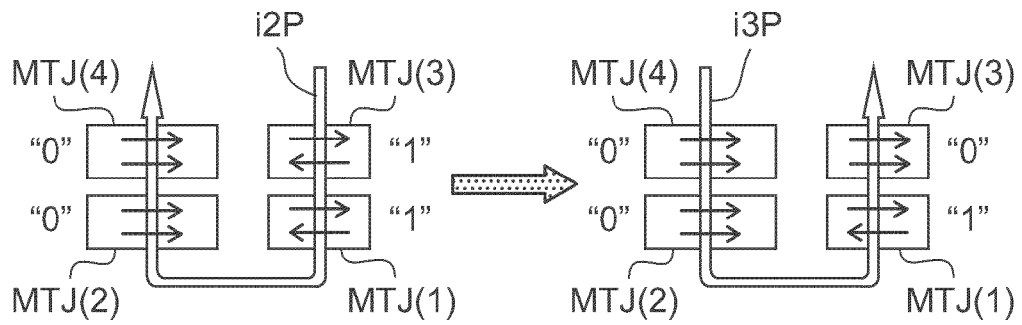
FIG. 17A to FIG. 18H are schematic cross sectional views illustrating a specific write operation.

FIG. 17A illustrates the operation in feeding the current i2P. That is, this is the operation in selecting the control line WL of the transistor Tr shown in FIG. 16 and feeding the current i2P from the first signal line BL(1) to the second signal line BL(2).

The second magnetic tunnel junction element MTJ(2) is put in the P state because the current i2P flows. The current i2P is larger than the fourth parallel threshold value. Accordingly, the fourth magnetic tunnel junction element MTJ(4) is put in the P state because the current i2P flows.

The stacking order of the stacked body ST1 with respect to the direction of the current i2P is opposite to the stacking order of the stacked body ST4. The current i2P is larger than the first antiparallel threshold value. Accordingly, the first magnetic tunnel junction element MTJ(1) is put in the AP state because the current i2P flows.

The stacking order of the stacked body ST3 with respect to the direction of the current i2P is opposite to the stacking order of the stacked body ST4. The current i2P is larger than the third antiparallel threshold value. Accordingly, the third magnetic tunnel junction element MTJ(3) is put in the AP state because the current i4P flows. In the embodiment, the AP state is a bit "1" and the P state is a bit "0". Moreover, as one example, 4 bits of information are expressed by the fourth magnetic tunnel junction element MTJ(4), the second magnetic tunnel junction element MTJ(2), the first magnetic tunnel junction element MTJ(1), and the third magnetic tunnel junction element MTJ(3) in this order.

Accordingly, in the operation shown in FIG. 17A, "0011" in 4 bits will be stored.

FIG. 17B illustrates the operation in feeding the current i3P after being into the state shown in FIG. 17A. That is, this is the operation in selecting the control line WL of the transistor Tr shown in FIG. 16 and feeding the current i3P from the second signal line BL(2) to the first signal line BL(1).

When the current i3P flows, only the third magnetic tunnel junction element MTJ(3) is put in the P state, and the states of other magnetic tunnel junction elements MTJ(1), MTJ(2), and MTJ(4) will not invert but be maintained.

Accordingly, in the operation illustrated in FIG. 17B, "00101" in 4 bits will be stored.

Figures 17C, 17D:
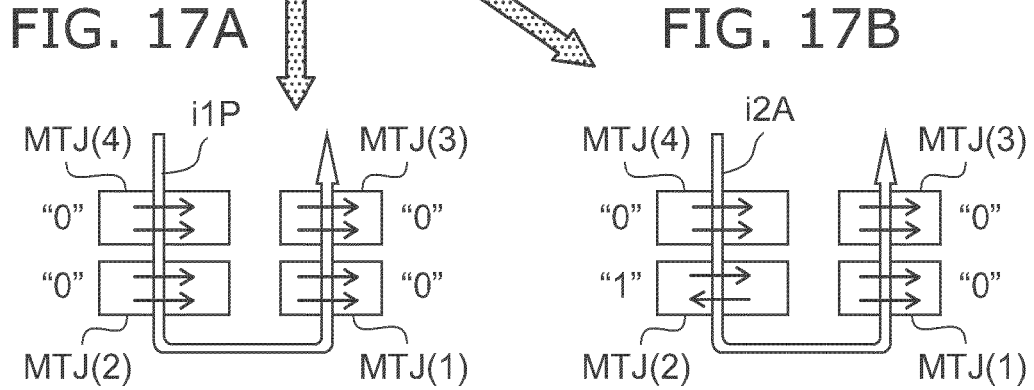

FIG. 17C illustrates the operation in feeding the current i1P after being into the state shown in FIG. 17A. That is, this is the operation in selecting the control line WL of the transistor Tr shown in FIG. 16 and feeding the current i1P from the second signal line BL(2) to the first signal line BL(1).

When the current i1P flows, the first magnetic tunnel junction element MTJ(1) and the third magnetic tunnel junction element MTJ(3) are put in the P state, and the states of the second magnetic tunnel junction element MTJ(2) and the fourth magnetic tunnel junction element MTJ(4) will not invert but be maintained.

Accordingly, in the operation shown in FIG. 17C, "0000" in 4 bits will be stored.

FIG. 17D illustrates the operation in feeding the current i2A after being into the state shown in FIG. 17A. That is, this is the operation in selecting the control line WL of the transistor Tr shown in FIG. 16 and feeding the current i2A from the second signal line BL(2) to the first signal line BL(1).

The second magnetic tunnel junction element MTJ(2) is put in the AP state when the current i2A flows. On the other hand, the first magnetic tunnel junction element MTJ(1) and the third magnetic tunnel junction element MTJ(3) are put in the P state when the current i2A flows. The state of the fourth magnetic tunnel junction element MTJ(4) will not invert but be maintained.

Accordingly, in the operation shown in FIG. 17D, "0100" in 4 bits will be stored.

Figures 17E, 17F:
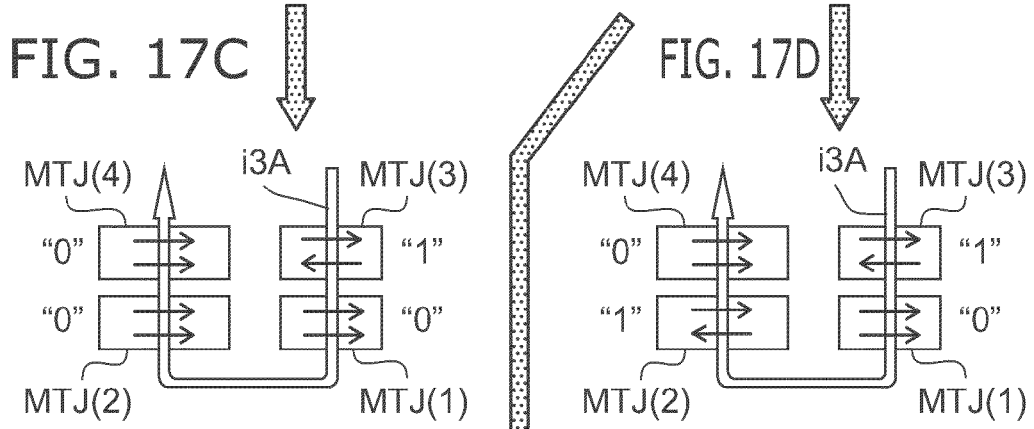

FIG. 17E illustrates the operation in feeding the current i3A after being into the state shown in FIG. 17C. That is, this is the operation in selecting the control line WL of the transistor Tr shown in FIG. 16 and feeding the current i3A from the first signal line BL(1) to the second signal line BL(2).

When the current i3A flows, only the third magnetic tunnel junction element MTJ(3) is put in the AP state, and the states of other magnetic tunnel junction elements MTJ(1), MTJ(2), and MTJ(4) will not change but be maintained.

Accordingly, in the operation shown in FIG. 17E, "0001" in 4 bits will be stored.

FIG. 17F illustrates the operation in feeding the current i3A after being into the state shown in FIG. 17D.

When the current i3A flows, only the third magnetic tunnel junction element MTJ(3) is put in the AP state, and the states of other magnetic tunnel junction elements MTJ(1), MTJ(2), and MTJ(4) will not change but be maintained.

Accordingly, in the operation shown in FIG. 17F, "0101" in 4 bits will be stored.

Figures 17G, 17H:
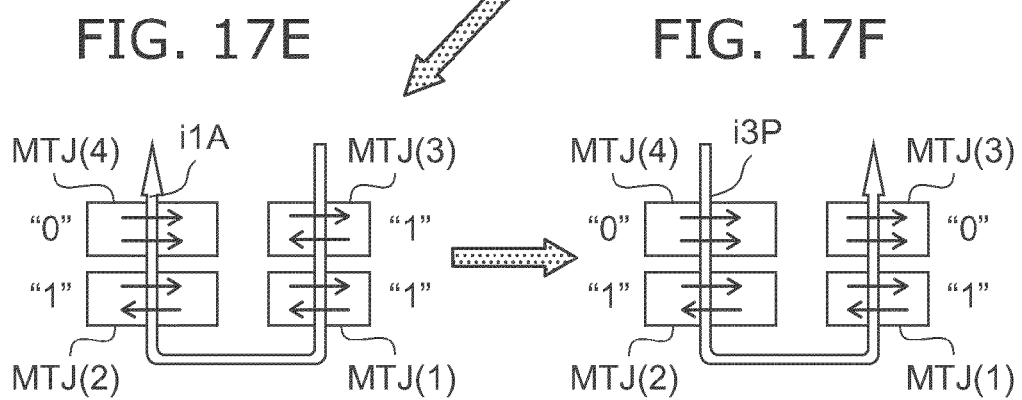

FIG. 17G illustrates the operation in feeding the current i1A after being into the state shown in FIG. 17D. That is, this is the operation in selecting the control line WL of the transistor Tr shown in FIG. 16 and feeding the current i1A from the first signal line BL(1) to the second signal line BL(2).

When the current i1A flows, the first magnetic tunnel junction element MTJ(1) and the third magnetic tunnel junction element MTJ(3) are put in the AP state, and the states of the second magnetic tunnel junction element MTJ(2) and the fourth magnetic tunnel junction element MTJ(4) will not invert but be maintained.

Accordingly, in the operation shown in FIG. 17G, "0111" in 4 bits will be stored.

FIG. 17H illustrates the operation in feeding the current i3P after being into the state shown in FIG. 17G.

When the current i3P flows, only the third magnetic tunnel junction element MTJ(3) is put in the P state, and the states of other magnetic tunnel junction elements MTJ(1), MTJ(2), and MTJ(4) will not change but be maintained.

Accordingly, in the operation shown in FIG. 17H, "0110" in 4 bits will be stored.

Figures 18A, 18B:
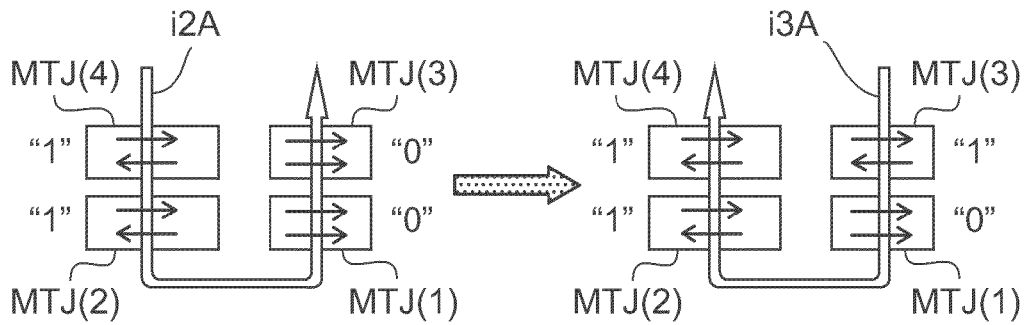

FIG. 18A illustrates the operation in feeding the current i2A. That is, this is the operation in selecting the control line WL of the transistor Tr shown in FIG. 16 and feeding the current i2A from the second signal line BL(2) to the first signal line BL(1).

The second magnetic tunnel junction element MTJ(2) is put in the AP state because the current i2A flows. The current i2A is larger than the fourth antiparallel threshold value. Accordingly, the fourth magnetic tunnel junction element MTJ(4) is put in the AP state because the current i2A flows.

The stacking order of the stacked body ST1 with respect to the direction of current i2A is opposite to the stacking order of the stacked body ST4. The current i2A is larger than the first parallel threshold value. Accordingly, the first magnetic tunnel junction element MTJ(1) is put in the P state because the current i2A flows.

The stacking order of the stacked body ST3 with respect to the direction of current i2A is opposite to the stacking order of the stacked body ST4. The current i2A is larger than the third parallel threshold value. Accordingly, the third magnetic tunnel junction element MTJ(3) is put in the P state because the current i2A flows.

Accordingly, in the operation shown in FIG. 18A, "1100" in 4 bits will be stored.

FIG. 18B illustrates the operation in feeding the current i3A after being into the state shown in FIG. 18A. That is, this is the operation in selecting the control line WL of the transistor Tr shown in FIG. 16 and feeding the current i3A from the first signal line BL(1) to the second signal line BL(2).

When the current i3A flows, only the third magnetic tunnel junction element MTJ(3) is put in the AP state, and the states of other magnetic tunnel junction elements MTJ(1), MTJ(2), and MTJ(4) will not change but be maintained.

Accordingly, in the operation illustrated in FIG. 18B, "1101" in 4 bits will be stored.

Figures 18C, 18D:
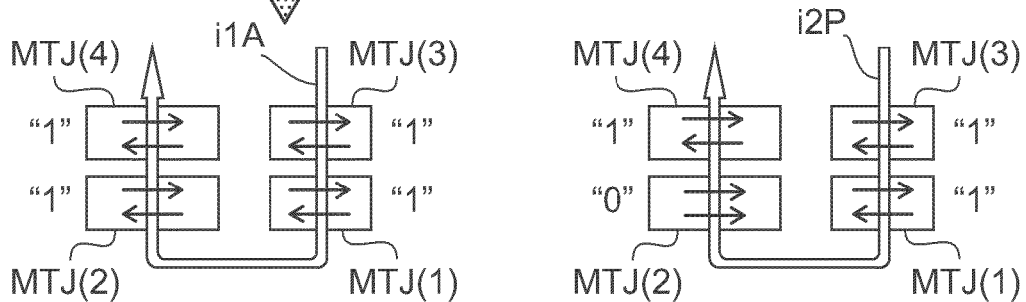

FIG. 18C illustrates the operation in feeding the current i1A after being into the state shown in FIG. 18A. That is, this is the operation in selecting the control line WL of the transistor Tr shown in FIG. 16 and feeding the current i1A from the first signal line BL(1) to the second signal line BL(2).

When the current i1A flows, the first magnetic tunnel junction element MTJ(1) and the third magnetic tunnel junction element MTJ(3) are put in the AP state, and the state of the second magnetic tunnel junction element MTJ(2) and the fourth magnetic tunnel junction element MTJ(4) will not invert but be maintained.

Accordingly, in the operation shown in FIG. 18C, "1101" in 4 bits will be stored.

Figures 18E, 18F:
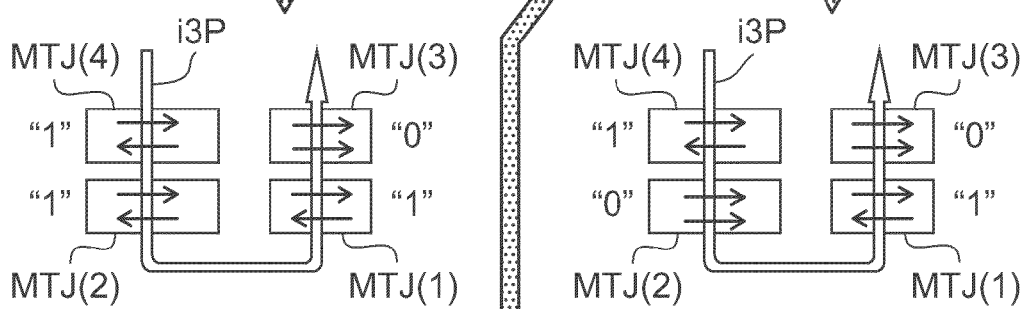

FIG. 18D illustrates the operation in feeding the current i2P after being into the state shown in FIG. 18E. That is, this is the operation in selecting the control line WL of the transistor Tr shown in FIG. 16 and feeding the current i2P from the first signal line BL(1) to the second signal line BL(2).

The second magnetic tunnel junction element MTJ(2) is put in the P state because the current i2P flows. On the other hand, the first magnetic tunnel junction element MTJ(1) and the third magnetic tunnel junction element MTJ(3) are put in the AP state when the current i2P flows. The state of the fourth magnetic tunnel junction element MTJ(4) will not invert but be maintained.

Accordingly, in the operation shown in FIG. 18D, "1011" in 4 bits will be stored.

FIG. 18E illustrates the operation in feeding the current i3P after being into the state shown in FIG. 18C. That is, this is the operation in selecting the control line WL of the transistor Tr shown in FIG. 16 and feeding the current i3P from the second signal line BL(2) to the first signal line BL(1).

When the current i3P flows, only the third magnetic tunnel junction element MTJ(3) is put in the P state, and the states of other magnetic tunnel junction elements MTJ(1), MTJ(2), and MTJ(4) will not change but be maintained.

Accordingly, in the operation shown in FIG. 18E, "1110" in 4 bits will be stored.

FIG. 18F illustrates the operation in feeding the current i3P after being into the state shown in FIG. 18D.

When the current i3P flows, only the third magnetic tunnel junction element MTJ(3) is put in the P state, and the states of other magnetic tunnel junction elements MTJ(1), MTJ(2), and MTJ(4) will not change but be maintained.

Accordingly, in the operation shown in FIG. 18F, "1010" in 4 bits will be stored.

Figures 18G, 18H:
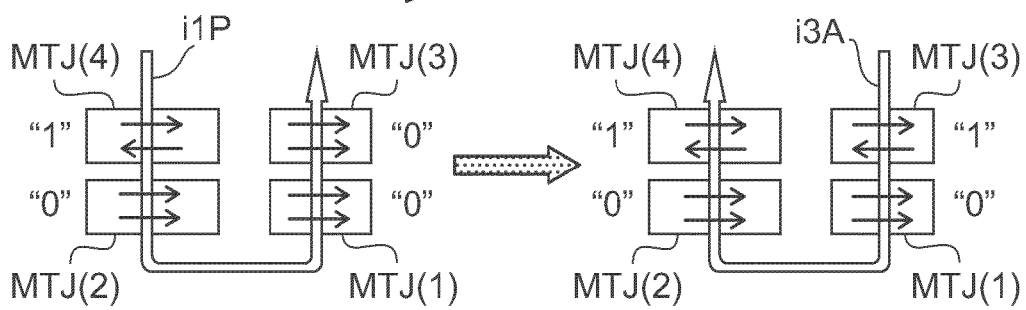

FIG. 18G illustrates the operation in feeding the current i1A after being into the state shown in FIG. 18D. That is, this is the operation in selecting the control line WL of the transistor Tr shown in FIG. 16 and feeding the current i1P from the second signal line BL(2) to the first signal line BL(1).

When the current i1P flows, the first magnetic tunnel junction element MTJ(1) and the third magnetic tunnel junction element MTJ(3) are put in the P state, and the states of the second magnetic tunnel junction element MTJ(2) and the fourth magnetic tunnel junction element MTJ(4) will not invert but be maintained.

Accordingly, in the operation shown in FIG. 18G, "1000" in 4 bits will be stored.

FIG. 18H illustrates the operation in feeding the current i3A after being into the state shown in FIG. 18G.

When the current i3A flows, only the third magnetic tunnel junction element MTJ(3) is put in the AP state, and the states of other magnetic tunnel junction elements MTJ(1), MTJ(2), and MTJ(4) will not change but be maintained.

Accordingly, in the operation shown in FIG. 18H, "1001" in 4 bits will be stored.

Here, the write operation is summarized.

When storing "0000", the current i1P is fed after feeding the current i2P.

When storing "0001", the current i3A is fed after feeding the current i2P and feeding the current i1P.

When storing "0010", the current i3P is fed after feeding the current i2P.

When storing "0011", the current i2P is fed.

When storing "0100", the current i2A is fed after feeding the current i2P.

When storing "0101", the current i3A is fed after feeding the current i2P and feeding the current i2A.

When storing "0110", the current i3P is fed after feeding the current i2P, feeding the current i2A and feeding the current i1A.

When storing "0111", the current i1A is fed after feeding the current i2P and feeding the current i2A.

When storing "1000", the current i1P is fed after feeding the current i2A and feeding the current i2P.

When storing "1001", the current i3A is fed after feeding the current i2A, feeding the current i2P and feeding the current i1P.

When storing "1010", the current i3P is fed after feeding the current i2A and feeding the current i2P.

When storing "1011", the current i2P is fed after feeding the current i2A.

When storing "1100", the current i2A is fed.

When storing "1101", the current i3A is fed after feeding the current i2A.

When storing "1110", the current i3P is fed after feeding the current i2A and feeding the current i1A.

When storing "1111", the current i1A is fed after feeding the current i2A.

Next, a specific example of the read operation of information is described.

When reading information, the signal generator 90 applies a read voltage, as the read voltage, to between the first signal line BL(1) and the second signal line BL(2). The read voltage is smaller than the smallest write voltage.

In the memory device 120, a total resistance value varies with a combination of the AP state and the P state of the first to fourth magnetic tunnel junction elements MTJ(1) to MTJ (4). Thus, the difference between the first signal line BL(1) and the reference voltage ref varies and the stored information can be determined.

Here, one example of the resistance value in the AP state and the P state of the first magnetic tunnel junction element MTJ(1) to the fourth magnetic tunnel junction element MTJ (4) is shown.

When the first magnetic tunnel junction element MTJ(1) is in the P state, the resistance value is 3 kΩ, for example. When the second magnetic tunnel junction element MTJ(2) is in the P state, the resistance value is 12 kΩ, for example. When the third magnetic tunnel junction element MTJ(3) is in the P state, the resistance value is 1.5 kΩ, for example. When the fourth magnetic tunnel junction element MTJ(4) is in the P state, the resistance value is 6 kΩ, for example. When the MR ratio (magnetoresistance change rate) of the first magnetic tunnel junction element MTJ(1) to the fourth magnetic tunnel junction element MTJ(4) is set to 200 percents (%), for example, the total resistance value in a combination of the AP state and the P state of the first magnetic tunnel junction element MTJ(1) to the fourth magnetic tunnel junction element MTJ(4) is as follows.

In the case of "0000", the total resistance value is 22.5 kΩ (parasitic resistance).
In the case of "0001", the total resistance value is 25.5 kΩ.
In the case of "0010", the total resistance value is 28.5 kΩ.
In the case of "0011", the total resistance value is 31.5 kΩ.
In the case of "0100", the total resistance value is 34.5 kΩ.
In the case of "0101", the total resistance value is 37.5 kΩ.
In the case of "0110", the total resistance value is 40.5 kΩ.
In the case of "0111", the total resistance value is 43.5 kΩ.
In the case of "1000", the total resistance value is 46.5 kΩ.
In the case of "1001", the total resistance value is 49.5 kΩ.
In the case of "1010", the total resistance value is 52.5 kΩ.
In the case of "1011", the total resistance value is 55.5 kΩ.
In the case of "1100", the total resistance value is 58.5 kΩ.
In the case of "1101", the total resistance value is 61.5 kΩ.
In the case of "1110", the total resistance value is 64.5 kΩ.
In the case of "1111", the total resistance value is 67.5 kΩ.

The output of the sense amplifier 91 varies with the above-described total resistance value. Therefore, the stored information can be determined according to the output of the sense amplifier 91.

In this manner, the memory device 120 can handle multi-valued operation of 4 bits by means of the first magnetic tunnel junction element MTJ(1) to the fourth magnetic tunnel junction element MTJ(4). Moreover, a simple configuration can be realized by setting the layer structure of each of the first stacked body ST1, the second stacked body ST2, the third stacked body ST3, and the fourth stacked body ST4 to the same layer structure.

As described above, with the memory device and the method for manufacturing the same according to the embodiment, in realizing a structure corresponding to multivalued operation using a magnetic tunnel junction element, the layer structure and the manufacturing process can be simplified.

Hereinabove, the embodiments of the invention and variants thereof are described. However, the invention is not limited to these examples. For example, for the first magnetic tunnel junction element MTJ(1) to the fourth magnetic tunnel junction element MTJ(4), the P state is a bit "0" and the AP state is a bit "1", but these states may be reversed. Moreover, for the first magnetic tunnel junction element MTJ(1) to the fourth magnetic tunnel junction element MTJ(4), the resistance value in the AP state is just an example and is not limited thereto.

Moreover, the specific examples of the write operation are shown in FIG. 5 and FIG. 6, and in FIG. 17 and FIG. 18, but the write operation may be based on methods other than the methods of these examples.

The stacking order of layers of each of the stacked bodies ST1, ST2, ST3, and ST4 may be opposite to the stacking order described above. In this case, the direction of the current d2 is the first direction and the direction of the current d1 is the second direction.

Moreover, one skilled in the art may suitably add or delete an element or perform a design change to each embodiment or variant thereof described above, or may suitably combine the features of each embodiment described above. Such practices are also included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
a first signal line;
a second signal line;
a transistor configured to control a conduction of each of a current in a first direction flowing between the first signal line and the second signal line and a current in a second direction opposite to the first direction;
a first memory region having a first magnetic tunnel junction element which is connected between the first signal line and one end of the transistor, a magnetization direction of which becomes parallel when a current not less than a first parallel threshold value flows in the first direction, and the magnetization direction of which becomes antiparallel when a current not less than a first antiparallel threshold value flows in the second direction; and
a second memory region having a second magnetic tunnel junction element which is connected between the second signal line and other end of the transistor, a magnetization direction of which becomes parallel when a current not less than a second parallel threshold value larger than the first parallel threshold value flows in the second direction, and the magnetization direction of which becomes antiparallel when a current not less than a second antiparallel threshold value larger than the first antiparallel threshold value flows in the first direction.

2. The memory device according to claim 1, wherein:
the first magnetic tunnel junction element includes a first stacked body, wherein a first magnetization free layer, a first tunnel barrier layer, and a first magnetization fixed layer are stacked in this order;
the second magnetic tunnel junction element includes a second stacked body, wherein a second magnetization free layer, a second tunnel barrier layer, and a second magnetization fixed layer are stacked in this order; and
along the first direction, a stacking order of the first stacked body and a stacking order of the second stacked body become opposite to each other.

3. The memory device according to claim 2, wherein a volume of the first magnetization free layer is smaller than a volume of the second magnetization free layer.

4. The memory device according to claim 2, wherein
the first magnetization free layer and the second magnetization free layer are provided in a same thickness on a same plane;
the first tunnel barrier layer and the second tunnel barrier layer are provided in a same thickness on a same plane; and
the first magnetization fixed layer and the second magnetization fixed layer are provided in a same thickness on a same plane.

5. The memory device according to claim 1, wherein the first memory region includes a third magnetic tunnel junction element which is provided between the first signal line and the first magnetic tunnel junction element, a magnetization direction of which becomes parallel when a current not less than a third parallel threshold value smaller than the first parallel threshold value flows in the first direction, and the magnetization direction of which becomes antiparallel when a current not less than a third antiparallel threshold value smaller than the first antiparallel threshold value flows in the second direction.

6. The memory device according to claim 2, wherein:
the first memory region includes a third magnetic tunnel junction element which is provided between the first signal line and the first magnetic tunnel junction element, a magnetization direction of which becomes parallel when a current not less than a third parallel threshold value smaller than the first parallel threshold value flows in the first direction, and the magnetization direction of which becomes antiparallel when a current not less than a third antiparallel threshold value smaller than the first antiparallel threshold value flows in the second direction;
the third magnetic tunnel junction element includes a third stacked body, wherein a third magnetization free layer, a third tunnel barrier layer, and a third magnetization fixed layer are stacked in this order; and
along the first direction, a stacking order of the first stacked body is the same as a stacking order of the third stacked body.

7. The memory device according to claim 1, wherein the second memory region includes a fourth magnetic tunnel junction element which is provided between the second signal line and the second magnetic tunnel junction element, a magnetization direction of which becomes parallel when a current not less than a fourth parallel threshold value smaller than the second parallel threshold value flows in the second direction, and the magnetization direction of which becomes antiparallel when a current not less than a fourth antiparallel threshold value smaller than the second antiparallel threshold value flows in the first direction.

8. The memory device according to claim 2, wherein:
the second memory region includes a fourth magnetic tunnel junction element which is provided between the second signal line and the second magnetic tunnel junction element, a magnetization direction of which becomes parallel when a current not less than a fourth parallel threshold value smaller than the second parallel threshold value flows in the second direction, and the magnetization direction of which becomes antiparallel when a current not less than a fourth antiparallel threshold value smaller than the second antiparallel threshold value flows in the first direction;
the fourth magnetic tunnel junction element includes a fourth stacked body, wherein a fourth magnetization free layer, a fourth tunnel barrier layer, and a fourth magnetization fixed layer are stacked in this order; and
along the first direction, a stacking order of the second stacked body is the same as a stacking order of the fourth stacked body.

9. The memory device according to claim 6, wherein:
the second memory region includes a fourth magnetic tunnel junction element which is provided between the second signal line and the second magnetic tunnel junction element, a magnetization direction of which becomes parallel when a current not less than a fourth parallel threshold value smaller than the second parallel threshold value flows in the second direction, and the magnetization direction of which becomes antiparallel when a current not less than a fourth antiparallel threshold value smaller than the second antiparallel threshold value flows in the first direction;
the fourth magnetic tunnel junction element includes a fourth stacked body, wherein a fourth magnetization free layer, a fourth tunnel barrier layer, and a fourth magnetization fixed layer are stacked in this order; and
along the first direction, a stacking order of the second stacked body is the same as a stacking order of the fourth stacked body.

10. The memory device according to claim 1, wherein a resistance value when a magnetization direction of the first magnetic tunnel junction element is antiparallel is larger than a resistance value when a magnetization direction of the second magnetic tunnel junction element is antiparallel.

11. The memory device according to claim 1, further comprising a plurality of the first memory regions and a plurality of the second memory regions, wherein:
the plurality of first memory regions are disposed in a row direction and in a column direction at a same pitch, respectively;
the plurality of second memory regions are disposed in the row direction and in the column direction at the same pitch, respectively; and
the plurality of first memory regions and the plurality of second memory regions are disposed with a half pitch offset to each other in the row direction and in the column direction.

12. The memory device according to claim 11, further comprising:
a plurality of the transistors provided at a first pitch in each of the row direction and the column direction;
a plurality of the first signal lines and a plurality of the second signal lines extending in one of the row direction and the column direction and alternately disposed one by one at a second pitch half the first pitch; and
a plurality of control lines extending in the other of the row direction and the column direction and arranged at the first pitch, wherein
the first memory region and the second memory region are formed in each of the plurality of transistors.

13. The memory device according to claim 1, wherein a set of the one first memory region and the one second memory region stores at least 2 bits of information.

* * * * *